(12) United States Patent
Chen et al.

(10) Patent No.: US 11,244,913 B2
(45) Date of Patent: Feb. 8, 2022

(54) SEMICONDUCTOR PACKAGE

(71) Applicant: MEDIATEK Inc., Hsin-Chu (TW)

(72) Inventors: Ying-Chih Chen, Hsin-Chu (TW);
Yen-Ju Lu, Hsin-Chu (TW); Che-Ya Chou, Hsin-Chu (TW); Hsing-Chih Liu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 134 days.

(21) Appl. No.: 16/699,851

(22) Filed: Dec. 2, 2019

(65) Prior Publication Data

US 2020/0402931 A1 Dec. 24, 2020

Related U.S. Application Data

(60) Provisional application No. 62/862,752, filed on Jun. 18, 2019.

(51) Int. Cl.
| | |
|---|---|
| *H01L 23/66* | (2006.01) |
| *H01L 23/31* | (2006.01) |
| *H01L 23/528* | (2006.01) |
| *H01L 23/532* | (2006.01) |
| *H01Q 1/22* | (2006.01) |

(52) U.S. Cl.
CPC .......... *H01L 23/66* (2013.01); *H01L 23/3121* (2013.01); *H01L 23/5286* (2013.01); *H01L 23/5329* (2013.01); *H01Q 1/2283* (2013.01)

(58) Field of Classification Search
CPC . H01L 23/66; H01L 23/3121; H01L 23/5286; H01L 23/5329
See application file for complete search history.

(56) References Cited

U.S. PATENT DOCUMENTS

| | | | |
|---|---|---|---|
| 7,728,774 B2 | 6/2010 | Akkermans et al. | |
| 9,230,900 B1 | 1/2016 | Qian et al. | |
| 9,728,853 B2 | 8/2017 | Hung | |
| 2003/0080836 A1* | 5/2003 | Nagaishi | H01L 23/66 |
| | | | 333/247 |

(Continued)

FOREIGN PATENT DOCUMENTS

| | | |
|---|---|---|
| CN | 105514603 A | 4/2016 |
| TW | 201015784 A | 4/2010 |

(Continued)

OTHER PUBLICATIONS

TW Office Action dated Sep. 30, 2020, in Taiwan application (No. 109118237).

(Continued)

*Primary Examiner* — Marc Anthony Armand
(74) *Attorney, Agent, or Firm* — McClure, Qualey & Rodack, LLP

(57) ABSTRACT

A semiconductor package includes a substrate, an electronic component, a dielectric layer a transmitting antenna, a receiving antenna and a FSS (Frequency selective surface) antenna. The electronic component is disposed on and electrically connected with the substrate. The dielectric layer has a dielectric upper surface. The transmitting antenna and the receiving antenna are formed adjacent to the substrate. The FSS antenna is formed adjacent to the dielectric upper surface of the dielectric layer. The FSS antenna is separated from the substrate by the dielectric layer in a wireless signal emitting direction.

19 Claims, 29 Drawing Sheets

(56) References Cited

U.S. PATENT DOCUMENTS

| | | |
|---|---|---|
| 2014/0035097 A1 | 2/2014 | Lin et al. |
| 2019/0096828 A1* | 3/2019 | Wu ..................... H01L 21/4857 |
| 2019/0115646 A1 | 4/2019 | Chiu et al. |
| 2019/0139915 A1 | 5/2019 | Dalmia et al. |
| 2019/0221917 A1* | 7/2019 | Kim ..................... H01Q 9/0407 |
| 2019/0319349 A1* | 10/2019 | Loeher ................ H01Q 9/0407 |
| 2020/0303822 A1* | 9/2020 | Yao ................... H01L 23/49816 |

FOREIGN PATENT DOCUMENTS

| | | |
|---|---|---|
| TW | 201633477 A | 9/2016 |
| TW | 201917800 A | 5/2019 |

OTHER PUBLICATIONS

EP Search Report dated Jun. 25, 2020 in application No. 19218054.5-1205.

\* cited by examiner

SEMICONDUCTOR PACKAGE

This application claims the benefit of U.S. Provisional application Ser. No. 62/862,752, filed Jun. 18, 2019, the disclosure of which is incorporated by reference herein in its entirety.

FIELD OF THE INVENTION

The invention relates to a semiconductor package, and more particularly to a semiconductor package having a FSS (Frequency selective surface) antenna.

BACKGROUND OF THE INVENTION

Conventional AoB (Antenna on Board) component includes a FSS (Frequency selective surface) antenna, a chip and a circuit board, wherein the FSS antenna and the chip are disposed on the same surface of the circuit board. However, such structure results in a large area of the AoB component.

SUMMARY OF THE INVENTION

In one embodiment of the invention, a semiconductor package is provided. The semiconductor package includes a substrate, an electronic component, a dielectric layer, a transmitting antenna, a receiving antenna and a FSS (Frequency selective surface) antenna. The electronic component is disposed on and electrically connected with the substrate. The dielectric layer has a dielectric upper surface. The transmitting antenna and the receiving antenna are formed adjacent to the substrate. The FSS antenna is formed adjacent to the dielectric upper surface of the dielectric layer. The FSS antenna is separated from the substrate by the dielectric layer in a wireless signal emitting direction.

In another embodiment of the invention, a semiconductor package is provided. The semiconductor package includes a substrate, an electronic component, a dielectric layer, a transmitting antenna, a receiving antenna and a FSS antenna. The electronic component is disposed on and electrically connected with the substrate. The dielectric layer has a dielectric upper surface and includes a dielectric portion surrounding a resonant cavity within which the electronic component is disposed. The transmitting antenna and the receiving antenna are formed adjacent to the substrate. The FSS antenna is formed adjacent to the dielectric upper surface of the dielectric layer. The FSS antenna is separated from the substrate by the dielectric portion in a wireless signal emitting direction, and the electronic component is exposed in the resonant cavity.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
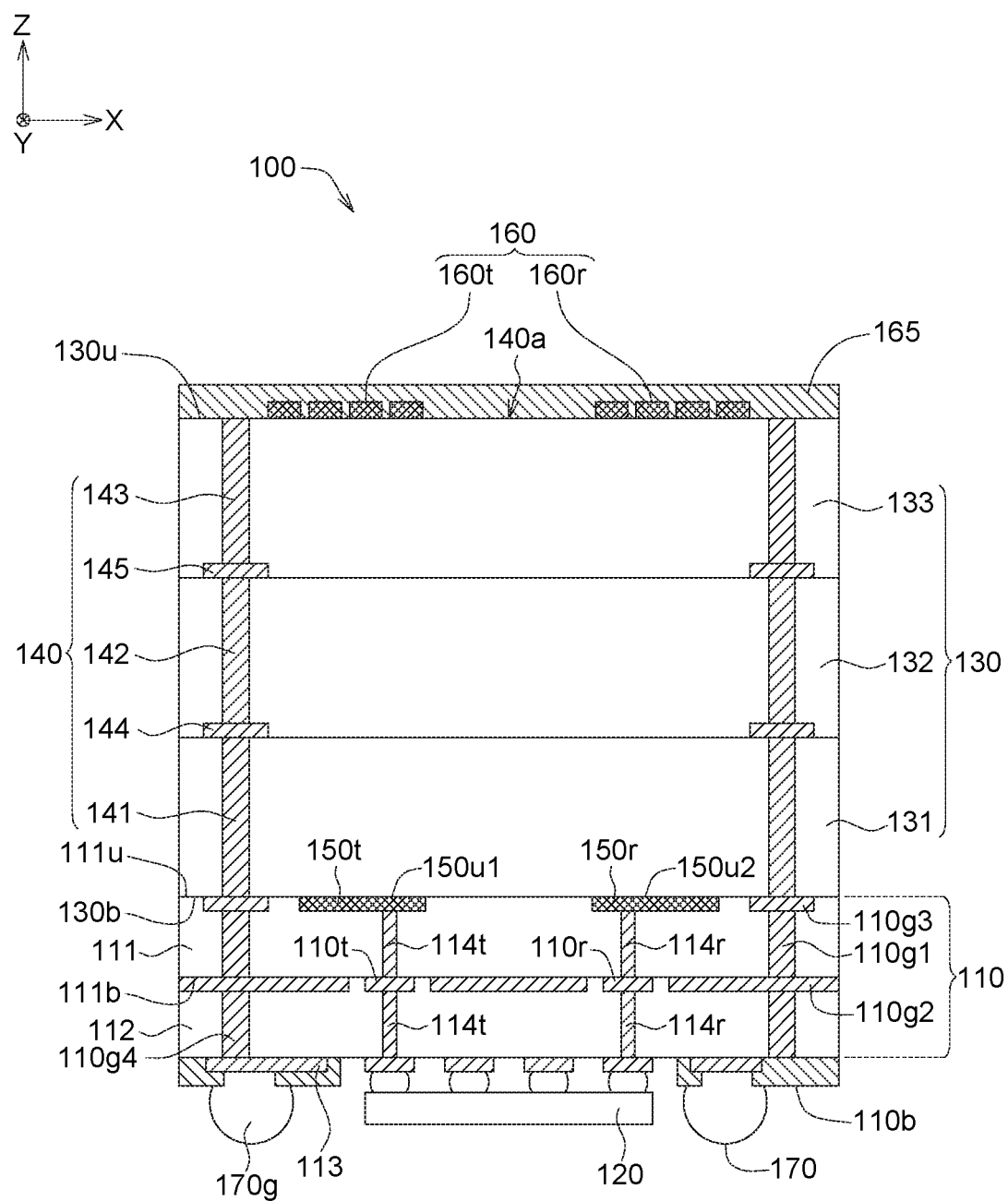
FIG. 1A illustrates a diagram of a semiconductor package according to an embodiment of the invention.
Figure 1B:
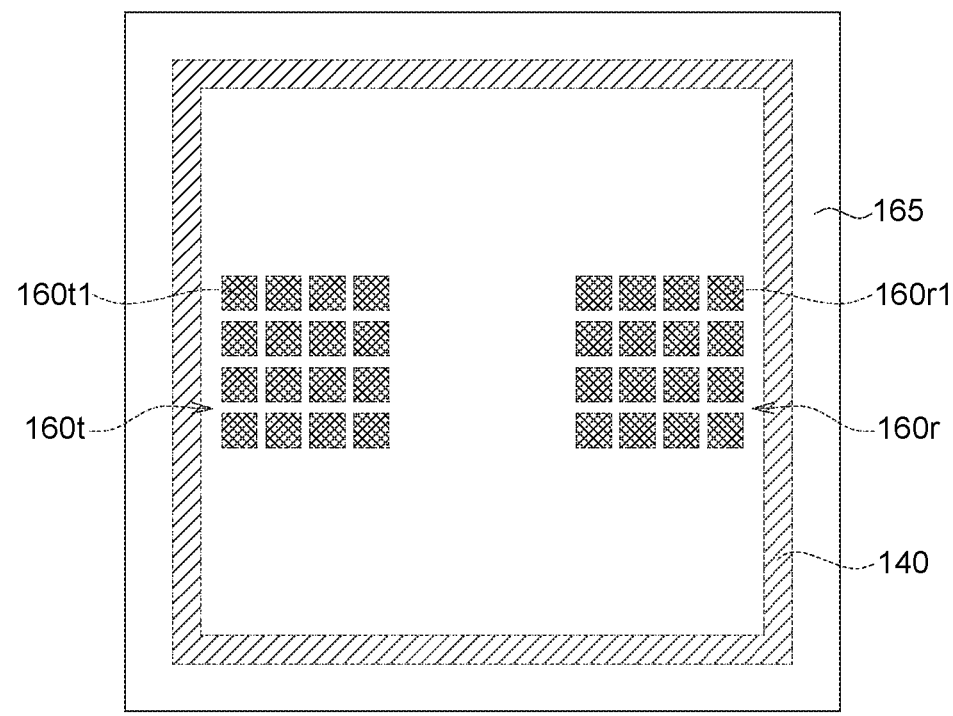
FIG. 1B illustrates a top view of the semiconductor package of FIG. 1A.
Figure 1C:
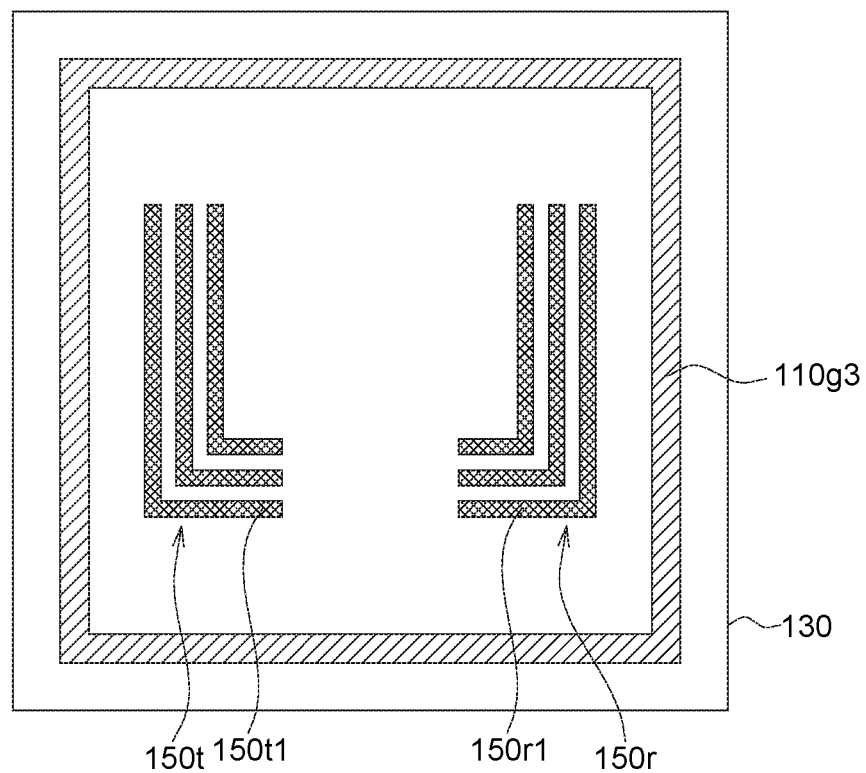
FIG. 1C illustrates a top view of a transmitting antenna and a receiving antenna of FIG. 1A.
Figure 1D:
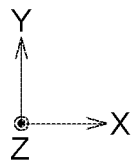
FIG. 1D illustrates a top view of a grounding layer of FIG. 1A.
Figure 1D:
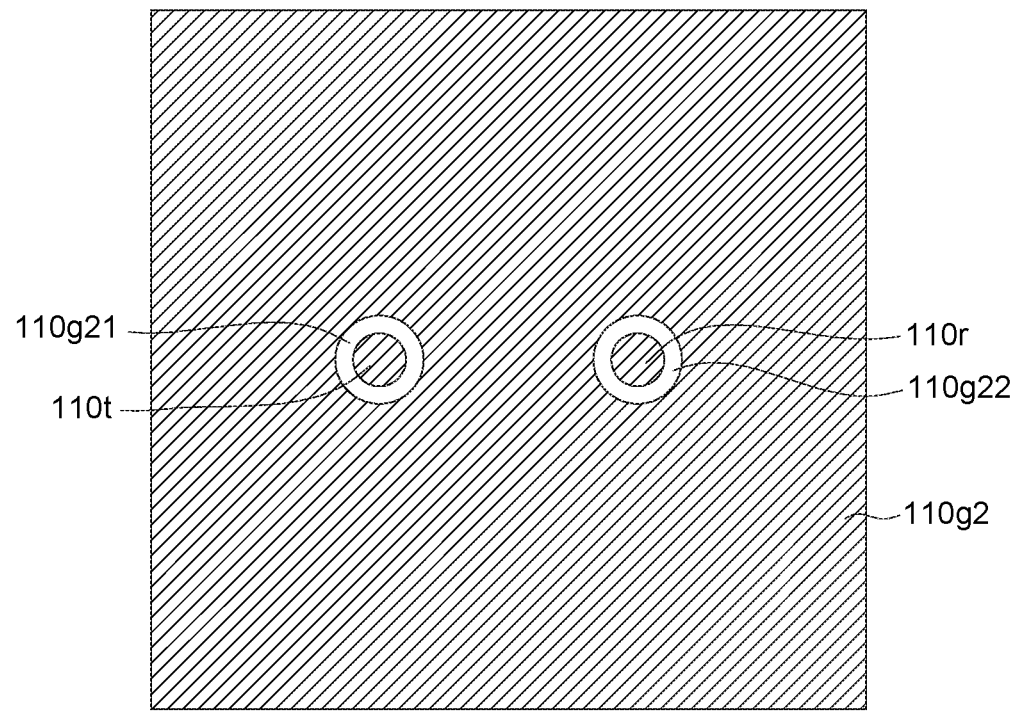

Referring to FIGS. 1A to 1D, FIG. 1A illustrates a diagram of a semiconductor package 100 according to an embodiment of the invention, FIG. 1B illustrates a top view of the semiconductor package 100 of FIG. 1A, FIG. 1C illustrates a top view of a transmitting antenna 150*t* and a receiving antenna 150*r* of FIG. 1A, and FIG. 1D illustrates a top view of a grounding layer 110*g*2 of FIG. 1A. In the present embodiment, the semiconductor package 100 is, for example, a distance measuring component.

The semiconductor package 100 includes a substrate 110, an electronic component 120, a dielectric layer 130, a shielding wall 140, a transmitting antenna 150*t*, a receiving antenna 150*r*, a FSS (Frequency selective surface) antenna 160, an insulation layer 165 and a plurality of contacts 170.

The electronic component 120 is disposed on and electrically connected with the substrate 110. The dielectric layer 130 has a dielectric upper surface 130*u* and a dielectric lower surface 130*b* opposite to the dielectric upper surface. The transmitting antenna 140*t* and the receiving antenna 140*r* are formed adjacent to the dielectric lower surface 130*b* of the dielectric layer 120. The FSS antenna 160 is formed adjacent to the dielectric upper surface 130*u* of the dielectric layer 130. The FSS antenna 160 is separated from the substrate 110 by the dielectric layer 130 in a wireless signal emitting direction, for example, the +Z direction. Due to the dielectric layer 130 being formed on two opposite surfaces of the dielectric layer 130 in a thickness direction (for example, Z direction), the semiconductor package 100 has a small size in a XY direction.

The substrate 110 includes, for example, at least one shielding portion 110*g*1, a grounding layer 110*g*2, at least one grounding pad 110*g*3, at least one grounding portion 110*g*4, a transmitting pad 110*t*, a receiving pad 110*r*, a first substrate layer 111, a second substrate layer 112, a conductive layer 113, at least one transmitting portion 114*t* and at least one receiving portion 114r. In an embodiment, the substrate 110 is, for example, an interposer substrate; however, such exemplification is not meant to be for limiting.

The first substrate layer 111 has a substrate upper surface 111u and a lower surface 111b opposite to the substrate upper surface 111u. The shielding portion 110g1, the grounding layer 110g2, the grounding pad 110g3, the grounding portion 110g4, the transmitting pad 110t, the receiving pad 110r, the transmitting portions 114t and the receiving portions 114r are embedded in the first substrate layer 111 and the second substrate layer 112. The grounding pad 110g3 is exposed from the substrate upper surface 111u for electrically connected to the shielding wall 140.

The shielding portion 110g1 is electrically connected the grounding pad 110g3 to the grounding layer 110g2, such that the grounding pad 110g3 is electrically connected to the grounding layer 110g2 through the shielding portion 110g1. In addition, the shielding portion 110g1 is, for example, a conductive pillar or a closed-ring surrounding the transmitting portion 114t and the receiving portion 114r, and the grounding pad 110g3 is, for example, a circular pad, a polygonal pad, or a closed-ring (as illustrated in FIG. 1C) surrounding the transmitting antenna 150t and the receiving antenna 150r.

The grounding layer 110g2 is formed on the lower surface 111b of the first substrate layer 111 and is electrically connected to a contact 170g through the grounding portion 110g4 and the conductive layer 113. In addition, the grounding portion 110g4 is, for example, a conductive pillar or a closed-ring surrounding the transmitting portion 114t and the receiving portion 114r. The grounding portion 110g4 electrically connects the grounding layer 110g2 to the conductive layer 113. The conductive layer 113 is formed on a lower surface of the second substrate layer 112. The contact 170g is formed the conductive layer 113 and electrically connected to a grounding potential (not illustrated) circuit board (not illustrated) when the semiconductor package 100 is disposed on the circuit board. As a result, the shielding wall 140 is electrically connected to the contact 170g through the grounding pad 110g3, the shielding portion 110g1, the grounding layer 110g2, the grounding portion 110g4 and the conductive layer 113. In addition, the conductive layer 113 includes at least one trace (not illustrated) and/or at least one pad (not illustrated), wherein the contact 170g and the electronic component 120 are formed on the pads of the conductive layer 113. Although not illustrated, the grounding portion 110g4 is, for example, electrically connected to the electronic component 120 through the conductive layer 113.

As illustrated in FIG. 1D, the grounding layer 110g2 has a first through hole 110g21 and a second through hole 110g22, the transmitting pad 110t is formed within the first through hole 110g21, and the receiving pad 110r is formed within the second through hole 110g22. In the present embodiment, the grounding layer 110g2 is an intact layer expect for the first through hole 110g21 and the second through hole 110g22.

In addition, the transmitting pad 110t and the receiving pad 110r are formed on the lower surface 111b of the first substrate layer 111. The transmitting portion 114t electrically connects the transmitting antenna 150t to the electronic component 120 through the transmitting pad 110t, and the receiving portion 114r electrically connects the receiving antenna 150r to the electronic component 120 through the receiving pad 110r. In an embodiment, the transmitting portion 114t and/or the receiving portion 114r is a conductive pillar or a closed-ring.

As illustrated in FIG. 1A, the electronic component 120 is, for example, a die, a chip, a semiconductor package structure, etc. The electronic component 120 is electrically connected to the transmitting antenna 150t through the conductive layer 113, the transmitting portion 114t and the transmitting pad 110t, and electrically connected to the receiving antenna 150r through the conductive layer 113, the receiving portion 114r and the receiving pad 110r.

As illustrated in FIG. 1A, the electronic component 120 could control the transmitting antenna 150t to emit wireless signal, for example, radio frequency (RF). The wireless signal passes through the dielectric layer 130 and is amplified by a transmitting antenna 160t of the FSS antenna 160. The wireless signal reflected by an object (not illustrated) is received by a receiving antenna 160r of the FSS antenna 160. The received wireless signal passes through the dielectric layer 130 and is received by the receiving antenna 150r. The electronic component 120 could threat the received wireless signal to obtain a distance between the semiconductor package 100 and the object.

In the present embodiment, the dielectric layer 130 is, for example, a physical material. The dielectric layer 130 is formed on the substrate upper surface 111u of the first substrate layer 111. The dielectric layer 130 includes a first layer 131 having the dielectric lower surface 130b, a second layer 132 and a third layer 133 having the dielectric upper surface 130u, wherein the second layer 132 is formed between the first layer 131 and the third layer 133. The dielectric layer 130 has a permittivity ranging between 1.1 mm to 1.3 mm, for example, 1.2 mm, and thus the dielectric layer 130 is regarded as a resonant portion for reducing energy loss of the wireless signal. The dielectric layer 130 is made of, for example, a low-K material. In an embodiment, the dielectric layer 130 is made of a material, for example, epoxy materials.

The shielding wall 140 is embedded in the dielectric layer 130 and extends to the dielectric lower surface 130b from the dielectric upper surface 130u. The shielding wall 140 includes a first wall 141, a second wall 142, a third wall 143, at least one first pad 144 and at least one second pad 145. In an embodiment, the shielding wall 140 is made of conductive material, for example, gold, silver, aluminum, copper or combination thereof.

In addition, the first wall 141, the second wall 142 and the third wall 143 form, for example, closed-rings, and the first pad 144 and/or the one second pad 145 is, for example, a closed-ring or a pillar.

The shielding wall 140 is electrically connected to the contact 170g (grounding contact) through the substrate 110. For example, the shielding wall 140 is electrically connected to the contact 170g through the grounding pad 110g3, the shielding portion 110g1, the grounding layer 110g2, the grounding portion 110g4 and the conductive layer 113.

Furthermore, the first wall 141 passes through the first layer 131 and is electrically connected to the grounding pad 110g3, and the first pad 144 is formed on the first wall 141 for electrically connected to the first wall 141. The second wall 142 passes through the second layer 132, and the second pad 145 is formed on the second wall 142 for electrically connected to the second wall 142. The third wall 143 passes through the third layer 133 and is electrically connected to the second pad 145. As result, the first wall 141, the second wall 142, the third wall 143, the first pad 144 and the second pad 145 are electrically connected to the contact 170g through the grounding pad 110g3 to form a shielding wall component.

In the present embodiment, shielding wall 140, the grounding pad 110g3, the shielding portion 110g1, the grounding layer 110g2 and the grounding portion 110g4 form a shielding wall component extending to the conductive pad 113.

As illustrated in FIGS. 1A and 1B, the shielding wall 140 and the grounding pad 110g3 surround the transmitting antenna 150t and the receiving antenna 150r for shielding electromagnetic waves from interfering with the transmitting antenna 150t, the receiving antenna 150r and/or the electronic component 120. In addition, the wireless signal transmitted within the dielectric layer 130 is prevented from being leaked from the shielding wall 140. In the present embodiment, the transmitting antenna 150t and the receiving antenna 150r are projected with respect to the dielectric lower surface 130b of the dielectric layer 130.

Furthermore, as illustrated in FIG. 1B, the shielding wall 140 is shaped as a closed-ring. As illustrated in FIGS. 1A and 1B, the shielding wall 140, the shielding portion 110g1, the grounding layer 110g2 and the grounding pad 110g3 form a recess having an opening 140a which allows the wireless signal to be emitted out of the semiconductor package 100. The recess could more effectively shield electromagnetic waves from be interfering with the transmitting antenna 150t, the receiving antenna 150r and/or the electronic component 120.

As illustrated in FIG. 1A, the transmitting antenna 150t and the receiving antenna 150r are embedded in the substrate 110. For example, the transmitting antenna 150t and the receiving antenna 150r are formed on the first substrate layer 111 of the substrate 110 and exposed from the substrate upper surface 111u of the first substrate layer 111. In an embodiment, the transmitting antenna 150t has a first antenna upper surface 150u1 and the receiving antenna 150r has a second antenna upper surface 150u2, wherein the upper surface 150u1, the second antenna upper surface 150u2 and the substrate upper surface 111u are aligned with or flush with each other. In addition, the transmitting antenna 150t and the receiving antenna 150r are projected with respect to the dielectric lower surface 130b of the dielectric layer 130.

As illustrated in FIG. 1C, the transmitting antenna 150t includes a plurality of traces 150t1 each extending in an L-shape, and the receiving antenna 150r includes a plurality of traces 150r1 each extending in an L-shape. However, such exemplification is not meant to be for limiting.

The FSS antenna 160 is formed on the dielectric upper surface 130u of the dielectric layer 130 and includes the transmitting antenna 160t and the receiving antenna 160r. As illustrated in FIG. 1B, the transmitting antenna 160t includes a plurality of transmitting elements 160t1 which are separated from each other and arranged in an array, and the receiving antenna 160r includes a plurality of receiving elements 160r1 which are separated from each other and arranged in an array. In addition, the antenna 160 is separated from the transmitting antenna 150t and the receiving antenna 150r by the dielectric layer 130.

As illustrated in FIG. 1B, the insulation layer 165 covering the FSS antenna 160 is formed on the dielectric upper surface 130u of the dielectric layer 130 for protecting the FSS antenna 160.

The contacts 170 are formed on a substrate lower surface 110b of the substrate 110. For example, the contacts 170 are formed on the pads of the conductive layer 113. The contacts 170 are, for example, solder balls, conductive pillars, conductive bumps, etc. The contacts 170 are, for example, electrically connected to the circuit board (not illustrated) when the semiconductor package 100 is disposed on the circuit board.

Figure 2A:
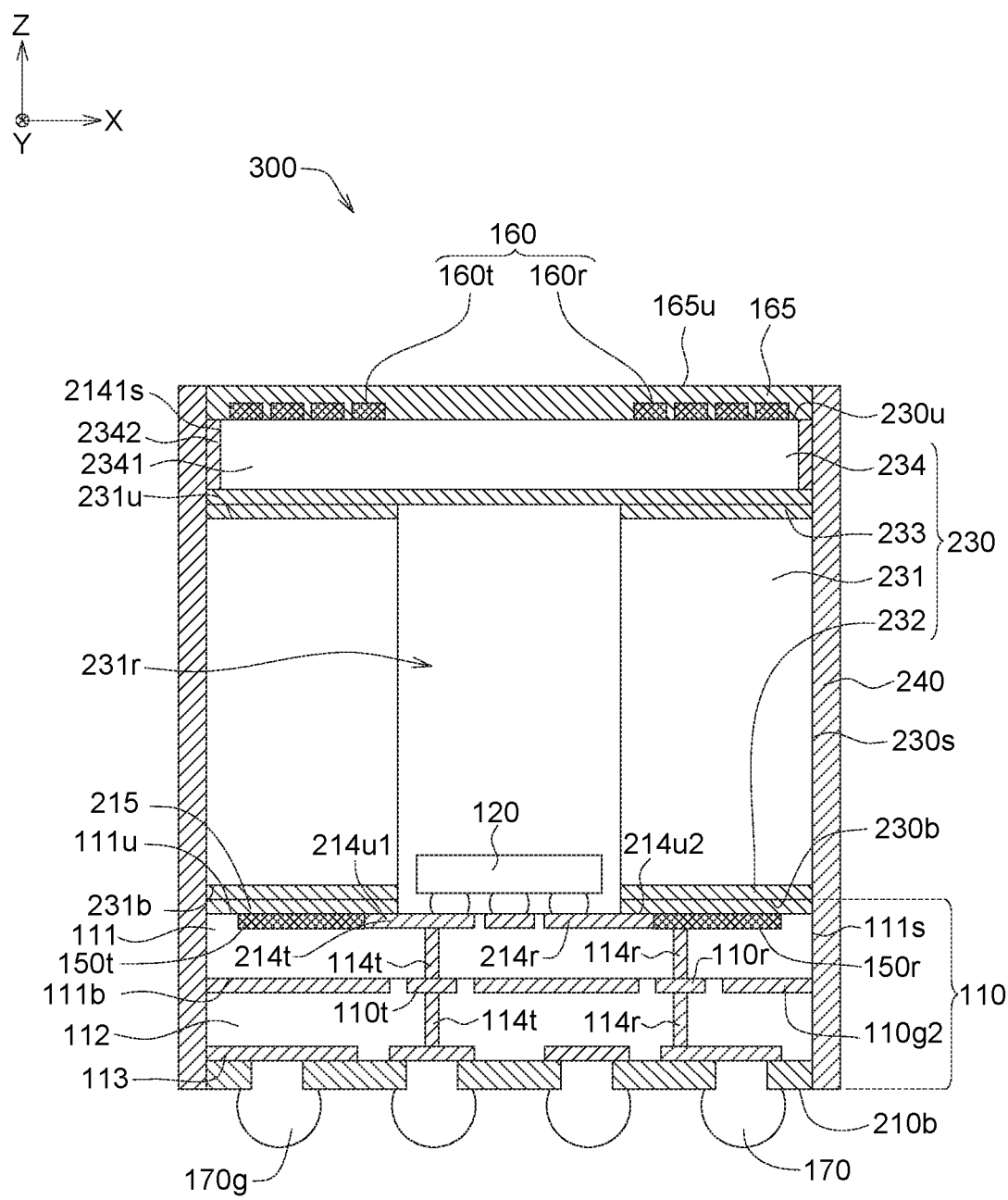
FIG. 2A illustrates a diagram of a semiconductor package according to another embodiment of the invention.
Figure 2B:
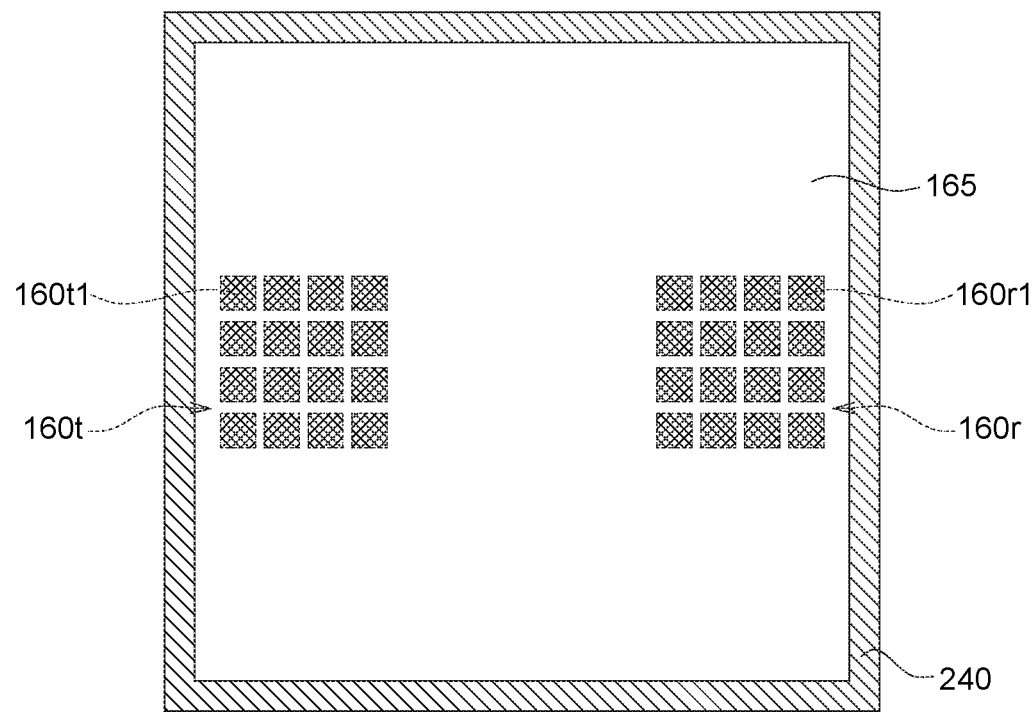
FIG. 2B illustrates a top view of the semiconductor package of FIG. 2A.

Referring to FIGS. 2A to 2B, FIG. 2A illustrates a diagram of a semiconductor package 200 according to another embodiment of the invention, and FIG. 2B illustrates a top view of the semiconductor package 200 of FIG. 2A.

The semiconductor package 200 includes a substrate 210, the electronic component 120, a dielectric layer 230, a shielding wall 240, the transmitting antenna 150t, the receiving antenna 150r, the FSS antenna 160, the insulation layer 165 and a plurality of contacts 170.

The substrate 210 includes, for example, the grounding layer 110g2, the transmitting pad 110t, the receiving pad 110r, the first substrate layer 111, the second substrate layer 112, the conductive layer 113, at least one transmitting portion 114t, at least one receiving portion 114r, at least one transmitting portion 214t, at least one receiving portion 214r and a first adhesion 215. In an embodiment, the substrate 210 is, for example, an interposer substrate.

The first substrate layer 111 has the substrate upper surface 111u and the lower surface 111b opposite to the substrate upper surface 111u. The grounding layer 110g2, the transmitting portion 114t, the receiving portion 114r, the transmitting portion 214t and the receiving portion 214r are embedded in the first substrate layer 111 and the second substrate layer 112. The grounding layer 110g2 extends to a lateral surface 111s of the first substrate layer 111 for being electrically connected to the shielding wall 240. The shielding wall 240 is electrically connected to the contact 170g through the conductive layer 113. The contact 170g is electrically connected to a grounding potential (not illustrated) circuit board (not illustrated) when the semiconductor package 100 is disposed on the circuit board. In an embodiment, the shielding wall 240 is made of a conductive material, for example, the same as or similar to that of the shielding wall 140.

In addition, the transmitting pad 110t and the receiving pad 110r are formed on the lower surface 111b of the first substrate layer 111. The transmitting portion 114t electrically connects the transmitting antenna 150t to the electronic component 120 through the transmitting pad 110t, and the receiving portion 114r electrically connects the receiving antenna 150r to the electronic component 120 through the receiving pad 110r.

The transmitting portion 214t has a first antenna upper surface 214u1 exposed from the substrate upper surface 111u of the first substrate layer 111, and the receiving portion 214r has a second antenna upper surface 214u2 exposed from the substrate upper surface 111u of the first substrate layer 111. The first antenna upper surface 214u1, the second antenna upper surface 214u2 and the substrate upper surface 111u are aligned with or flush with each other. The transmitting portion 214t connects the transmitting antenna 150t to the electronic component 120, and the receiving portion 214r connects the receiving antenna 150r to the electronic component 120. The first adhesion 215 is formed on the substrate upper surface 111u of the first substrate layer 111 for adhering to the dielectric layer 230. In an embodiment, the transmitting portion 214t and/or the receiving portion 214r is, for example, conductive trace.

The dielectric layer 230 is formed on the first adhesion 215 of the substrate 210. The dielectric layer 230 includes a dielectric portion 231 having an upper surface 231u and a lower surface 231b opposite to the upper surface 231u, a second adhesion 232 having a dielectric lower surface 230b, a third adhesion 233 and an interposer 234 having the dielectric upper surface 230u. The dielectric portion 231 has a peripheral surface 230s extending between the upper surface 231u and the lower surface 231b. The second adhesion 232 is formed on the lower surface 231b, and the third adhesion 233 is formed on the upper surface 231u.

The dielectric portion 231 surrounds a resonant cavity 231r within which the electronic component 120 is disposed. The resonant cavity 231r is, for example, a gas layer (for example, air layer) or a vacuum layer, that is, there is no physical component formed within the resonant cavity 231r.

The electronic component 120 could control the transmitting antenna 150t to emit wireless signal, for example, RF. The wireless signal passes through the dielectric layer 230 and is amplified by a transmitting antenna 160t of the FSS antenna 160. The wireless signal reflected by an object (not illustrated) is received by a receiving antenna 160r of the FSS antenna 160. The received wireless signal passes through the dielectric layer 230 and is received by the receiving antenna 150r. The electronic component 120 could threat the received wireless signal to obtain a distance between the semiconductor package 200 and the object.

In addition, the dielectric portion 231, the second adhesion 232 and/or the third adhesion 233 could have permittivity the same as or similar to that of the dielectric layer 130. Thus, the dielectric portion 231 could be regarded as a resonant portion for reducing energy loss of the wireless signal. In addition, the dielectric portion 231 is made of a material, for example, same as or similar to the dielectric layer 130.

The interposer 234 includes a substrate 2341 and a shielding portion 2342 surrounding a lateral surface 2341s of the substrate 2341 and electrically connected to the shielding wall 240. The shielding portion 2342 is a pillar or a closed-ring surrounding the lateral surface 2341s of the substrate 2341. In addition, the substrate 2341 could have permittivity the same as or similar to that of the dielectric layer 130.

The FSS antenna 160 is formed on the dielectric upper surface 230u of the interposer 234 and includes the transmitting antenna 160t and the receiving antenna 160r. As illustrated in FIG. 2B, the transmitting antenna 160t includes a plurality of transmitting elements 160t1 which are separated from each other and arranged in an array, and the receiving antenna 160r includes a plurality of receiving elements 160r1 which are separated from each other and arranged in an array. In addition, the antenna 160 is separated from the transmitting antenna 150t and the receiving antenna 150r by the dielectric layer 230.

The insulation layer 165 covers the FSS antenna 160 for protecting the FSS antenna 160. The insulation layer 165 has an upper surface 165u.

The shielding wall 240 coves the peripheral surface 230s of the dielectric layer 230 and extends between a substrate lower surface 210b of the substrate 210 and the dielectric upper surface 230u. In the present embodiment, the shielding wall 240 extends to the substrate lower surface 210b from the upper surface 165u of the insulation layer 165.

Figure 3:
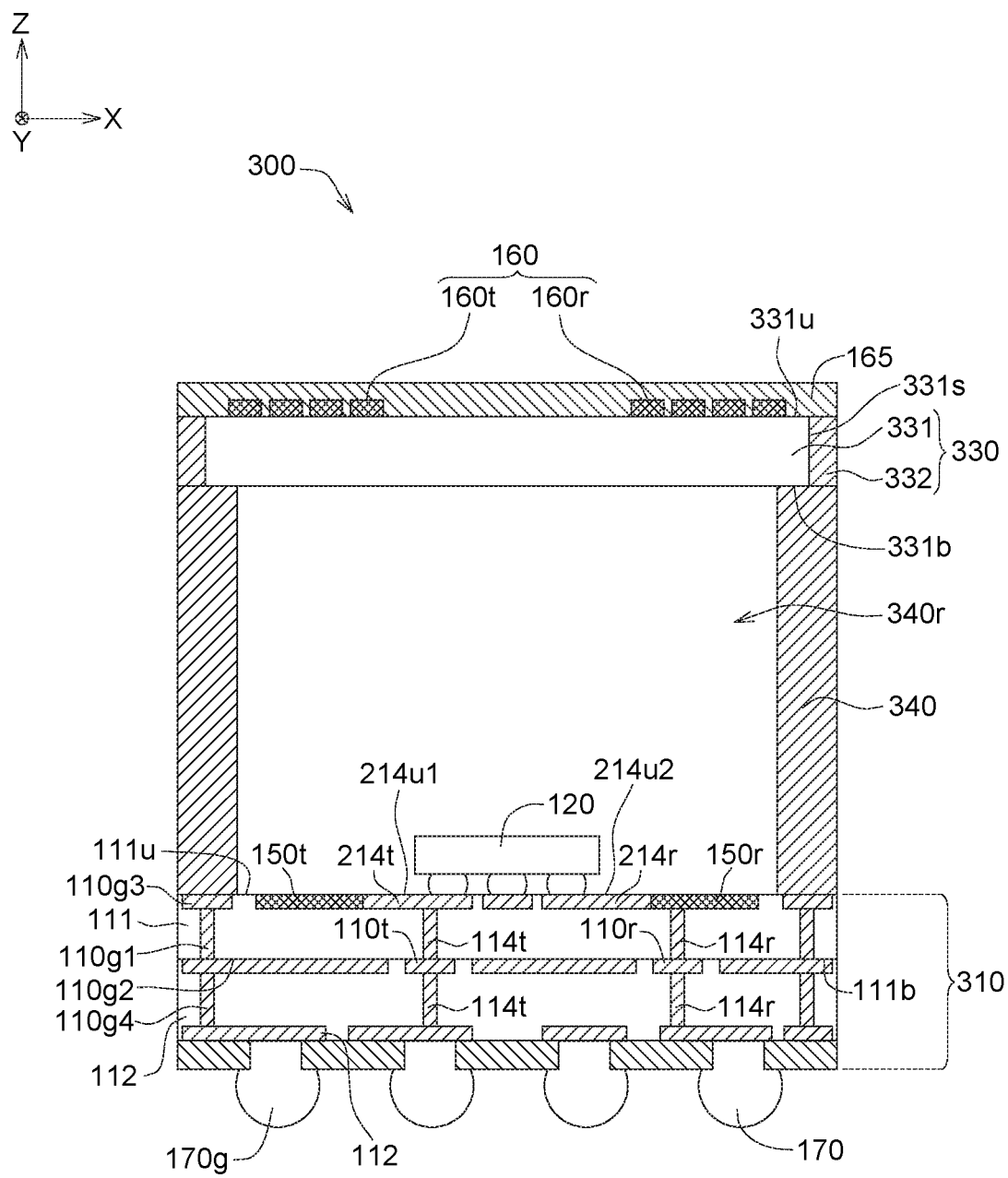
FIG. 3 illustrates a diagram of a semiconductor package according to another embodiment of the invention.

Referring to FIG. 3, FIG. 3 illustrates a diagram of a semiconductor package 300 according to another embodiment of the invention.

The semiconductor package 300 includes a substrate 310, the electronic component 120, a dielectric layer 330, a shielding wall 340, the transmitting antenna 150t, the receiving antenna 150r, the FSS antenna 160, the insulation layer 165 and a plurality of contacts 170.

The substrate 310 includes, for example, at least one shielding portion 110g1, the grounding layer 110g2, at least one grounding pad 110g3, at least one grounding portion 110g4, the transmitting pad 110t, the receiving pad 110r, the first substrate layer 111, the second substrate layer 112, the conductive layer 113, at least one transmitting portion 114t, at least one receiving portion 114r, at least one transmitting portion 214t and at least one receiving portion 214r. In an embodiment, the substrate 310 is, for example, an interposer substrate.

The first substrate layer 111 has the substrate upper surface 111u and the lower surface 111b opposite to the substrate upper surface 111u. The shielding portion 110g1, the grounding layer 110g2, the grounding pad 110g3, the grounding portion 110g4, the transmitting pad 110t, the receiving pad 110r, the transmitting portions 114t, the receiving portions 114r, the transmitting portions 214t and the receiving portions 214r are embedded in the first substrate layer 111 and the second substrate layer 112. The grounding pad 110g3 is exposed from the substrate upper surface 111u for electrically connected to the shielding wall 340.

The shielding portion 110g1 is electrically connected the grounding pad 110g3 and the grounding layer 110g2, such that the grounding pad 110g3 is electrically connected to the grounding layer 110g2 through the shielding portion 110g1. In addition, the shielding portion 110g1 is, for example, a conductive pillar or a closed-ring surrounding the transmitting portion 114t and the receiving portion 114r, and the grounding pad 110g3 is, for example, a circular pad, a polygonal pad, or a closed-ring surrounding the transmitting antenna 150t and the receiving antenna 150r.

The grounding layer 110g2 is formed on the lower surface 111b of the first substrate layer 111 and is electrically connected to the contact 170g through the grounding portion 110g4 and the conductive layer 113. In addition, the grounding portion 110g4 is, for example, a conductive pillar or a closed-ring surrounding the transmitting portion 114t and the receiving portion 114r. The grounding portion 110g4 electrically connects the grounding layer 110g2 to the conductive layer 113. The conductive layer 113 is formed on a lower surface of the second substrate layer 112. The contact 170g is formed the conductive layer 113 and electrically connected to a grounding potential (not illustrated) circuit board (not illustrated) when the semiconductor package 100 is disposed on the circuit board. As a result, the shielding wall 140 is electrically connected to the contact 170g through the grounding pad 110g3, the shielding portion 110g1, the grounding layer 110g2, the grounding portion 110g4 and the conductive layer 113. In addition, the conductive layer 113 includes at least one trace (not illustrated) and/or at least one pad (not illustrated), wherein the contact 170g and the electronic component 120 are formed on the pads of the conductive layer 113. Although not illustrated, the grounding portion 110g4 is, for example, electrically connected to the electronic component 120 through the conductive layer 113.

In addition, the transmitting pad 110t and the receiving pad 110r are formed on the lower surface 111b of the first substrate layer 111. The transmitting portion 114t electrically connects the transmitting antenna 150t to the electronic component 120 through the transmitting pad 110t, and the receiving portion 114r electrically connects the receiving antenna 150r to the electronic component 120 through the receiving pad 110r. In an embodiment, the transmitting portion 114t and/or the receiving portion 114r is, for example, conductive pillar.

The transmitting portion 214t has the first antenna upper surface 214u1 exposed from the substrate upper surface 111u of the first substrate layer 111, and the receiving portion 214r has the second antenna upper surface 214u2 exposed from the substrate upper surface 111u of the first substrate layer 111. The first antenna upper surface 214u1, the second antenna upper surface 214u2 and the substrate upper surface 111u are aligned with or flush with each other. The transmitting portion 214t connects the transmitting antenna 150t to the electronic component 120, and the receiving portion 214r connects the receiving antenna 150r to the electronic component 120. The first adhesion 215 is formed on the substrate upper surface 111u of the first substrate layer 111 for adhering to the dielectric layer 230. In an embodiment, the transmitting portion 214t and/or the receiving portion 214r are, for example, conductive traces.

The dielectric layer 330 is, for example, an interposer. The dielectric layer 330 includes a substrate 331 and a shielding portion 332 surrounding a lateral surface 331s of the substrate 331 and electrically connected to the shielding wall 340. The shielding portion 332 is, for example, a closed-ring or a pillar. The substrate 331 has a dielectric upper surface 331u and a dielectric lower surface 331b opposite to the dielectric upper surface 331u. In addition, the substrate 331 could have permittivity the same as or similar to that of the dielectric layer 130.

The shielding wall 340 is disposed between the dielectric lower surface 331b of the dielectric layer 330 and the substrate 310. The shielding wall 340 surrounds a resonant cavity 340r within which the electronic component 120 is disposed. The transmitting antenna 150t and the receiving antenna 150r are exposed from the resonant cavity 340r. The resonant cavity 340r is, for example, a gas layer (for example, air layer) or a vacuum layer, that is, there is no physical component formed within the resonant cavity 340r. The resonant cavity 340r exposes the transmitting antenna 150t, the receiving antenna 150r, the transmitting portion 214t, the receiving portion 214r and the electronic component 120.

Figure 4A:
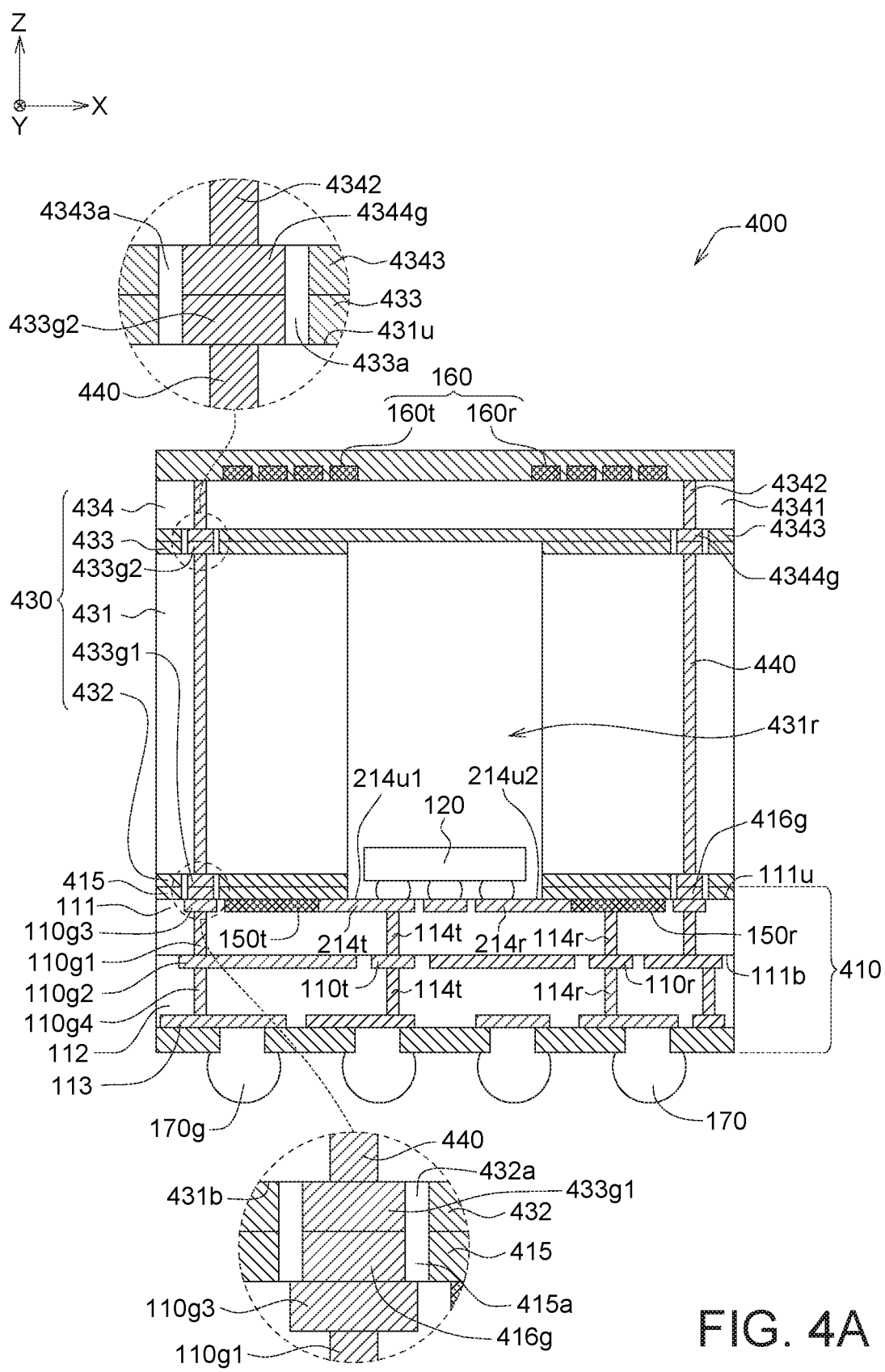
FIG. 4A illustrates a diagram of a semiconductor package according to another embodiment of the invention.
Figure 4B:
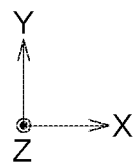
FIG. 4B illustrates a top view of a transmitting antenna and a receiving antenna of FIG. 4A.
Figure 4B:
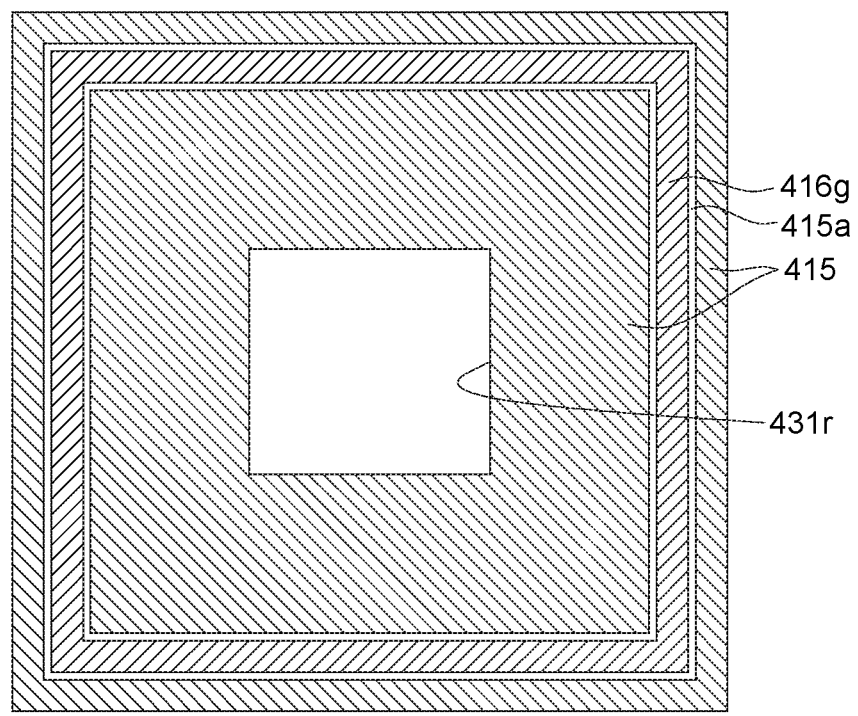

Referring to FIGS. 4A to 4B, FIG. 4A illustrates a diagram of a semiconductor package 400 according to another embodiment of the invention, and FIG. 4B illustrates a top view of a transmitting antenna 150t and a receiving antenna 150r of FIG. 4A.

The semiconductor package 400 includes a substrate 410, the electronic component 120, a dielectric layer 430, a shielding wall 440, the transmitting antenna 150t, the receiving antenna 150r, the FSS antenna 160, the insulation layer 165 and a plurality of contacts 170.

The substrate 410 includes, for example, at least one shielding portion 110g1, the grounding layer 110g2, at least one grounding pad 110g3, at least one grounding portion 110g4, the transmitting pad 110t, the receiving pad 110r, the first substrate layer 111, the second substrate layer 112, the conductive layer 113, at least one transmitting portion 114t, at least one receiving portion 114r, at least one transmitting portion 214t, at least one receiving portion 214r, a adhesion 415 and a grounding pad 416g. In an embodiment, the substrate 410 is, for example, an interposer substrate.

The first substrate layer 111 has the substrate upper surface 111u and the lower surface 111b opposite to the substrate upper surface 111u. The shielding portion 110g1, the grounding layer 110g2, the grounding pad 110g3, the grounding portion 110g4, the transmitting pad 110t, the receiving pad 110r, the transmitting portions 114t, the receiving portions 114r, the transmitting portions 214t and the receiving portions 214r are embedded in the first substrate layer 111 and the second substrate layer 112. The grounding pad 110g3 is exposed from the substrate upper surface 111u for being electrically connected to the shielding wall 440.

The shielding portion 110g1 is electrically connected the grounding pad 110g3 and the grounding layer 110g2, such that the grounding pad 110g3 is electrically connected to the grounding layer 110g2 through the shielding portion 110g1. In addition, the shielding portion 110g1 is a conductive pillar or a closed-ring surrounding the transmitting portion 114t and the receiving portion 114r, and the grounding pad 110g3 is a circular pad, a polygonal pad, or a closed-ring surrounding the transmitting antenna 150t, the receiving antenna 150r, the transmitting portion 214t and the receiving portion 214r.

The grounding layer 110g2 is formed on the lower surface 111b of the first substrate layer 111 and is electrically connected to the contact 170g through the grounding portion 110g4 and the conductive layer 113. In addition, the grounding portion 110g4 is, for example, a conductive pillar or a closed-ring surrounding the transmitting portion 114t and the receiving portion 114r. The grounding portion 110g4 electrically connects the grounding layer 110g2 to the conductive layer 113. The conductive layer 113 is formed on a lower surface of the second substrate layer 112. The contact 170g is formed the conductive layer 113 and electrically connected to a grounding potential (not illustrated) circuit board (not illustrated) when the semiconductor package 100 is disposed on the circuit board. As a result, the shielding wall 140 is electrically connected to the contact 170g through the grounding pad 110g3, the shielding portion 110g1, the grounding layer 110g2, the grounding portion 110g4 and the conductive layer 113. In addition, the conductive layer 113 includes at least one trace (not illustrated) and/or at least one pad (not illustrated), wherein the contact 170g and the electronic component 120 are formed on the pads of the conductive layer 113. Although not illustrated, the grounding portion 110g4 is, for example, electrically connected to the electronic component 120 through the conductive layer 113.

In addition, the transmitting pad 110t and the receiving pad 110r are formed on the lower surface 111b of the first substrate layer 111. The transmitting portion 114t electrically connects the transmitting antenna 150t to the electronic component 120 through the transmitting pad 110t, and the receiving portion 114r electrically connects the receiving antenna 150r to the electronic component 120 through the receiving pad 110r. In an embodiment, the transmitting portion 114t and/or the receiving portion 114r is conductive pillar.

The transmitting portion 214t has the first antenna upper surface 214u1 exposed from the substrate upper surface 111u of the first substrate layer 111, and the receiving portion 214r has the second antenna upper surface 214u2 exposed from the substrate upper surface 111u of the first substrate layer 111. The first antenna upper surface 214u1, the second antenna upper surface 214u2 and the substrate upper surface 111u are aligned with or flush with each other. The transmitting portion 214t connects the transmitting antenna 150t to the electronic component 120, and the receiving portion 214r connects the receiving antenna 150r to the electronic component 120. The first adhesion 415 is formed on the substrate upper surface 111u of the first substrate layer 111 for adhering to the dielectric layer 430. In an embodiment, the transmitting portion 214t and/or the receiving portion 214r are, for example, conductive traces.

As illustrated in FIG. 4A, the first adhesion 415 has a through hole 415a. The grounding pad 416g is formed within the through hole 415a, and the shielding wall 440 is electrically connected to the grounding pad 110g3 through the grounding pad 416g.

The dielectric layer 430 is formed on the first adhesion 415 of the substrate 410. The dielectric layer 430 includes a dielectric portion 431 having an upper surface 431u and a lower surface 431b opposite to the upper surface 431u, a second adhesion 432 formed on the lower surface 431b, a third adhesion 433 formed on the upper surface 431u, a first grounding pad 433g1 and a second grounding pad 433g2 and an interposer 434. The second adhesion 432 has a through hole 432a, and the first grounding pad 433g1 is formed on the lower surface 431b and within the through hole 432a. The third adhesion 433 has a through hole 433a, and the second grounding pad 433g2 is formed on the upper surface 431u and within the through hole 433a. In addition, at least one portion of the through hole 432a could overlap at least one portion of the through hole 415a.

The shielding wall 440 is embedded in the dielectric portion 431 and connects the first grounding pad 433g1 to the second grounding pad 433g2. The shielding wall 440 is electrically to the contact 170g through the substrate 410. For example, the shielding wall 440 is electrically to the contact 170g through the first grounding pad 433g1, the grounding pad 416g, the grounding pad 110g3, the shielding portion 110g1, the grounding layer 110g2, the grounding portion 110g4 and the conductive layer 113.

The interposer 434 includes a substrate 4341, a shielding portion 4342, a fourth adhesion 4343 and a grounding pad 4344g. The shielding portion 4342 is embedded in the substrate 4341 and electrically connected to the grounding pad 4344g. The shielding portion 4342 is, for example, a closed-ring or a pillar. The fourth adhesion 4343 has a through hole 4343a, and the grounding pad 4344g is formed within the through hole 4343a. The shielding portion 4342 is electrically connected to the shielding wall 440 through the grounding pad 4344g and the second grounding pad 433g2. In addition, at least one portion of the through hole 433a could overlap at least one portion of the through hole 4343a. In addition, the substrate 4341 could have permittivity the same as or similar to that of the dielectric layer 130.

Figure 5A:
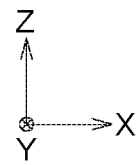
FIG. 5A illustrates a diagram of a semiconductor package according to another embodiment of the invention.
Figure 5A:
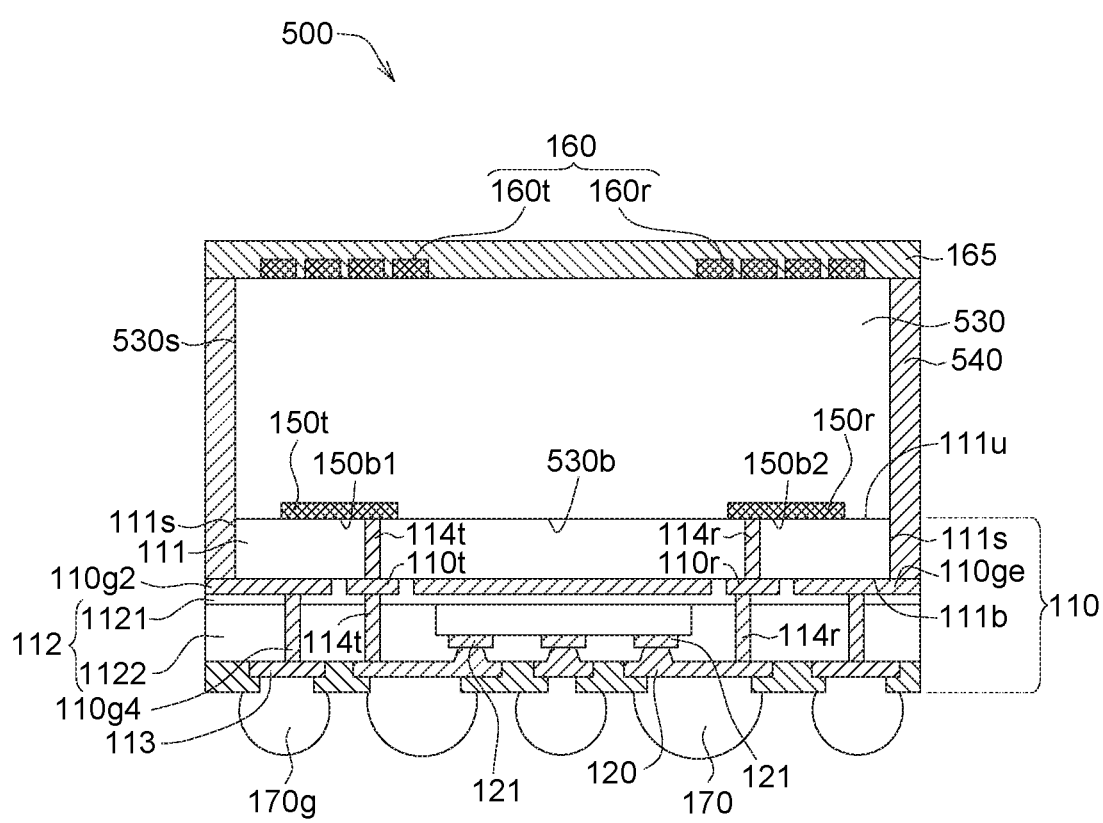
Figure 5B:
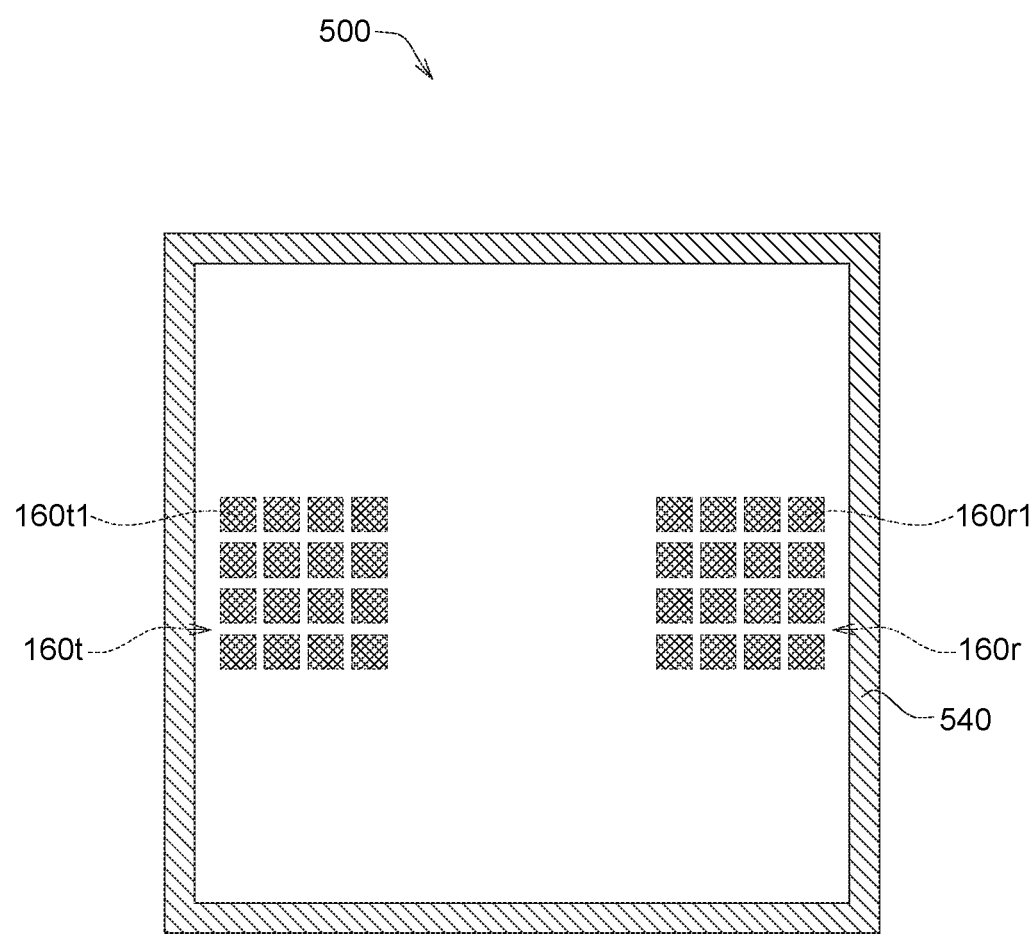
FIG. 5B illustrates a top view of the semiconductor package of FIG. 5A.

Referring to FIGS. 5A to 5B, FIG. 5A illustrates a diagram of a semiconductor package 500 according to another embodiment of the invention, and FIG. 5B illustrates a top view of the semiconductor package 500 of FIG. 5A.

The semiconductor package 500 includes a substrate 510, the electronic component 120, a dielectric layer 530, a shielding wall 540, the transmitting antenna 150t, the receiving antenna 150r, the FSS antenna 160, the insulation layer 165 and a plurality of contacts 170.

The substrate 510 includes, for example, the grounding layer 110g2, at least one grounding portion 110g4, the transmitting pad 110t, the receiving pad 110r, the first substrate layer 111, the second substrate layer 112, the conductive layer 113, at least one transmitting portion 114t and at least one receiving portion 114r.

The first substrate layer 111 has the substrate upper surface 111u and the lower surface 111b opposite to the substrate upper surface 111u. The grounding layer 110g2, the transmitting pad 110t, the receiving pad 110r, the grounding portion 110g4, the transmitting portions 114t and the receiving portions 114r are embedded in the first substrate layer 111 and the second substrate layer 112.

The grounding layer 110g2 is exposed from the first substrate layer 111 for electrically connected to the shielding wall 540. For example, the grounding layer 110g2 includes an edge portion 110ge exposed form the substrate 510 for being electrically connected the shielding wall 540.

The second substrate layer 112 includes a carrier layer 1121 and a covering layer 1122, wherein the carrier layer 1121 covers the grounding layer 110g2, the transmitting pad 110t and the receiving pad 110r, the electronic component 120 is disposed on the carrier layer 1121, and the covering layer 1122 encapsulates the electronic component 120 and has at least one opening to expose at least one contact 121 of the electronic component 120. The conductive layer 113 is electrically connected to the contacts 121 through the openings of the covering layer 1122.

The grounding layer 110g2 is formed on the lower surface 111b of the first substrate layer 111 and is electrically connected to the contact 170g through the grounding portion 110g4 and the conductive layer 113. In addition, the grounding portion 110g4 is a conductive pillar or a closed-ring surrounding the transmitting portion 114t, the receiving portion 114r and the electronic component 120. The grounding portion 110g4 electrically connects the grounding layer 110g2 to the conductive layer 113. The conductive layer 113 is formed on a lower surface of the second substrate layer 112. The contact 170g is formed the conductive layer 113 and electrically connected to a grounding potential (not illustrated) circuit board (not illustrated) when the semiconductor package 100 is disposed on the circuit board. As a result, the shielding wall 540 is electrically connected to the contact 170g through the grounding layer 110g2, the grounding portion 110g4 and the conductive layer 113. In addition, the conductive layer 113 includes at least one trace (not illustrated) and/or at least one pad (not illustrated), wherein the contact 170g and the electronic component 120 are formed on the pads of the conductive layer 113.

In addition, the transmitting pad 110t and the receiving pad 110r are formed on the lower surface 111b of the first substrate layer 111. The transmitting portion 114t electrically connects the transmitting antenna 150t to the electronic component 120 through the transmitting pad 110t, and the receiving portion 114r electrically connects the receiving antenna 150r to the electronic component 120 through the receiving pad 110r.

In the present embodiment, the electronic component 120 is embedded in the substrate 510. For example, the electronic component 120 is embedded in the covering layer 1122 of the second substrate layer 112 of the substrate 510.

In the present embodiment, the dielectric layer 530 is physical material, and the transmitting antenna 150t and the receiving antenna 150r are embedded in the dielectric layer 530. The dielectric layer 530 could have permittivity, for example, the same as or similar to that of the dielectric layer 130. In addition, the transmitting antenna 150t and the receiving antenna 150r have a first antenna lower surface 150b1 and a second antenna lower surface 150b2 respectively, and the first antenna lower surface 150b1, the second antenna lower surface 150b2 and a dielectric lower surface 530b of the dielectric layer 530 are aligned with or flush with each other.

The dielectric layer 530 is a molding component covering a substrate upper surface 111u of the substrate 510 and encapsulates the transmitting antenna 150t and the receiving antenna 150r. In an embodiment, the dielectric layer 530 could include, for example, a Novolac-based resin, an epoxy-based resin, a silicone-based resin, or another suitable encapsulant. Suitable fillers also could be included, such as powdered SiO2. The dielectric layer 530 could be applied using any of a number of molding techniques, such as compression molding, injection molding, or transfer molding.

The shielding wall 540 covers the edge portion 110ge of the grounding layer 110g2, a lateral surface 111s of the first substrate layer 111 and a lateral surface 530s of the dielectric layer 530. In addition, the lateral surface 530s and the lateral surface 111s are aligned with or flush with each other.

FIGS. 6A to 6G illustrate manufacturing processes of the semiconductor package 100 of FIG. 1A.

Figure 6A:
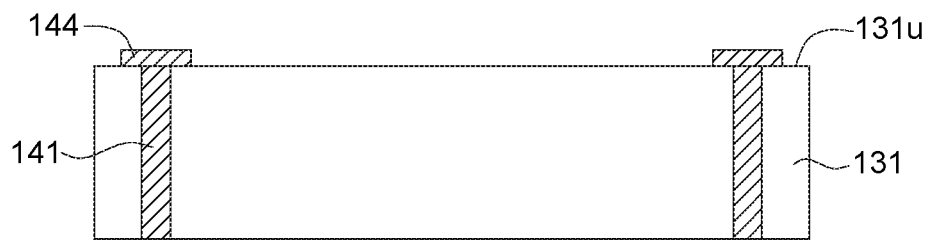
FIGS. 6A to 6G illustrate manufacturing processes of the semiconductor package of FIG. 1A.

As illustrated in FIG. 6A, the first wall 141 is formed in the first layer 131. The first layer 131 has the dielectric lower surface 130b and an upper surface 131u opposite to the dielectric lower surface 130b. The first wall 141 extends to the upper surface 131u from the dielectric lower surface 130b. Then, the first pad 144 is formed on the first wall 141.

Figure 6B:
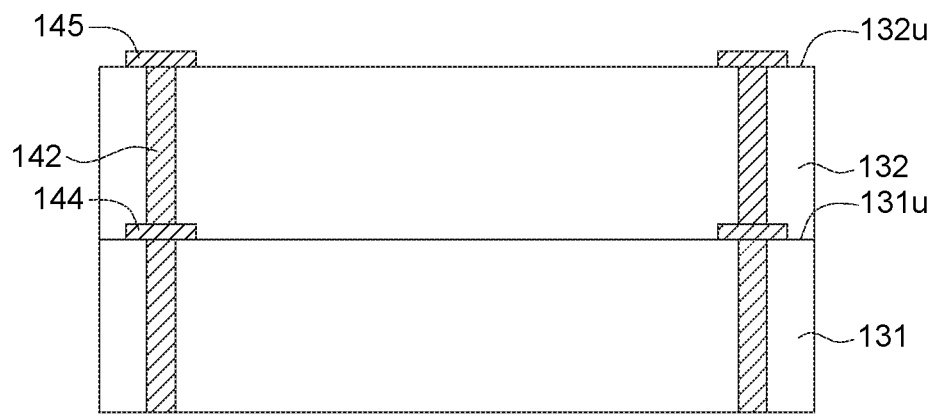

As illustrated in FIG. 6B, the second layer 132 covering the first pad 144 is formed on the upper surface 131u of the first layer 131. Then, the second wall 142 extending to the first pad 144 from an upper surface 132u of the second layer 132 is formed in the second layer 132.

Figure 6C:
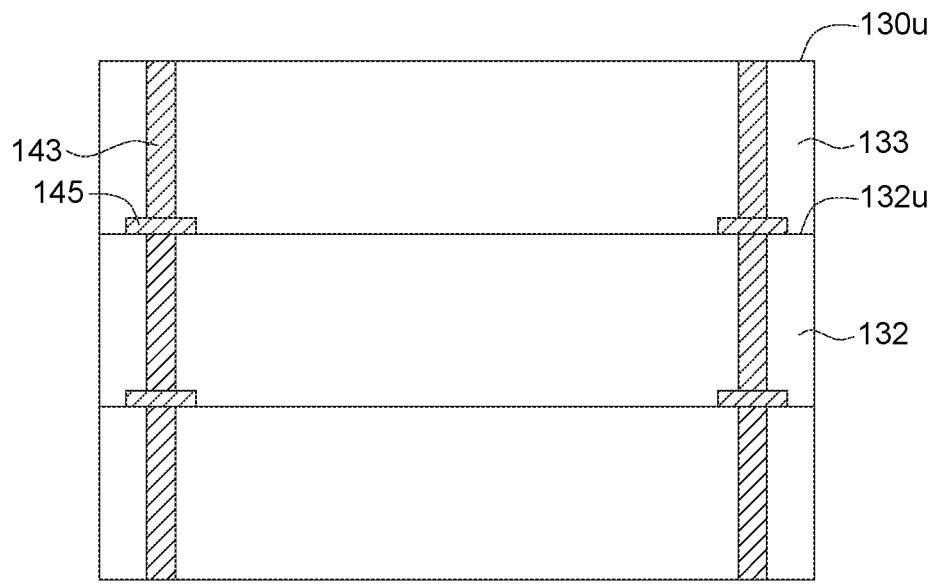

As illustrated in FIG. 6C, the third layer 133 having the dielectric upper surface 130u is formed on the upper surface 132u of the second layer 132. Then, the third wall 143 extending to the second pad 145 from the dielectric upper surface 130u is formed.

Figure 6D:
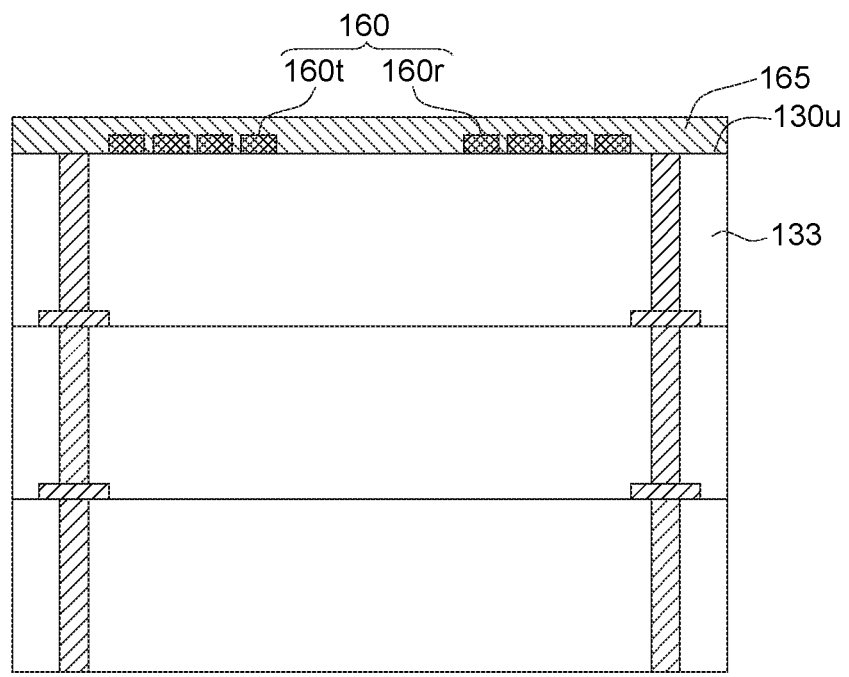

As illustrated in FIG. 6D, the FSS antenna 160 including the transmitting antenna 160t and the receiving antenna 160r is formed on the dielectric upper surface 130u of the third layer 133.

Then, the insulation layer 165 covering the FSS antenna 160 is formed on the dielectric upper surface 130u of the third layer 133.

Figure 6E:
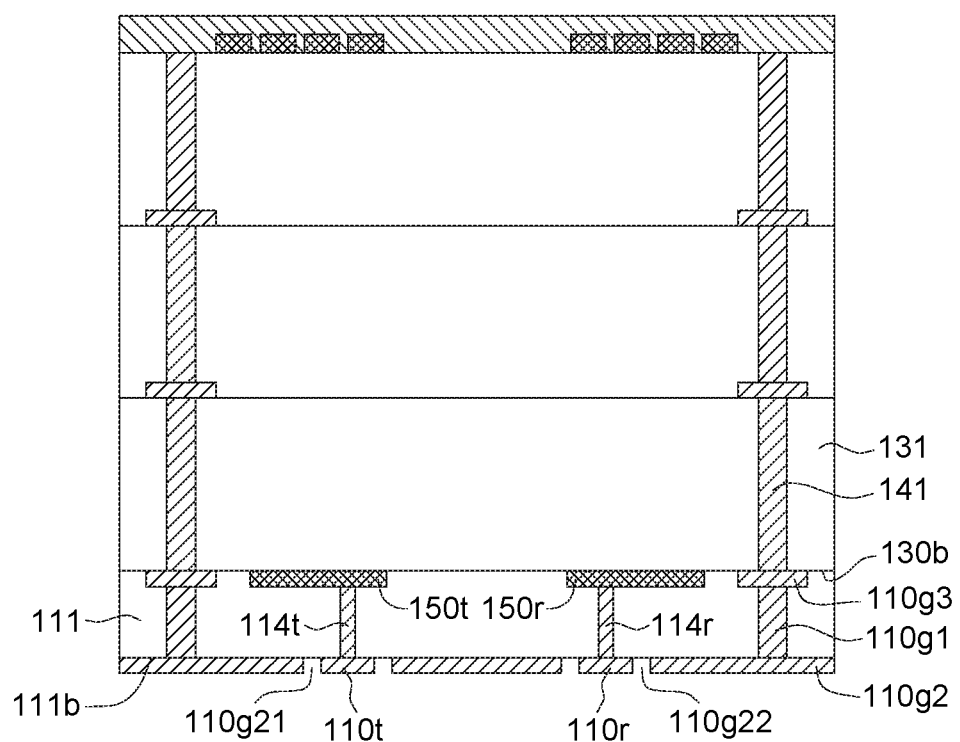

As illustrated in FIG. 6E, the transmitting antenna 150t, the receiving antenna 150r and the grounding pad 110g3 is formed on the dielectric lower surface 130b of the first layer 131. Then, the first substrate layer 111 covering the transmitting antenna 150t, the receiving antenna 150r and the grounding pad 110g3 is formed on the dielectric lower surface 130b of the first layer 131. Then, the shielding portion 110g1, at least one transmitting portion 114t and at least one receiving portion 114r are formed in the first substrate layer 111, wherein the shielding portion 110g1 extends to the grounding pad 110g3 from the lower surface 111b of the first substrate layer 111, the transmitting portion 114t extends to the transmitting antenna 150t from the lower surface 111b, and the receiving portion 114r extends to the receiving antenna 150r from the lower surface 111b of the first substrate layer 111. Then, the grounding layer 110g2 having the first through hole 110g21 and the second through hole 110g22 is formed on the lower surface 111b of the first substrate layer 111. Then, the transmitting pad 110t electrically connected to the transmitting portion 114t and the receiving pad 110r electrically connected to the receiving portion 114r are formed within the first through hole 110g21 and the second through hole 110g22 respectively.

Figure 6F:
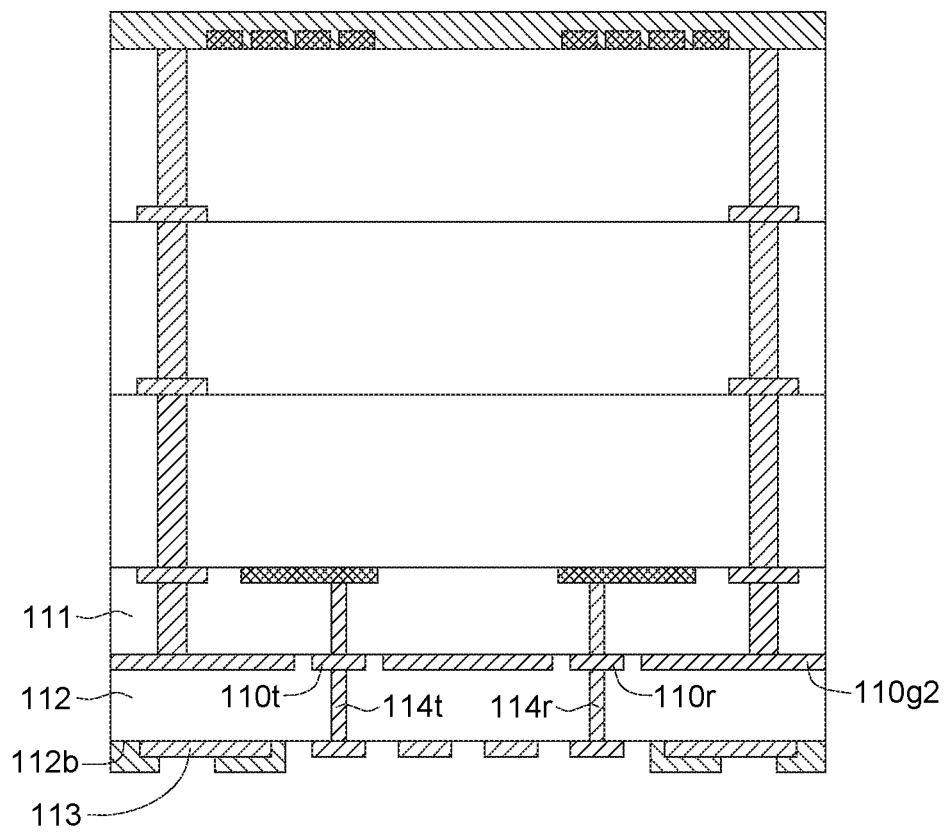

As illustrated in FIG. 6F, the second substrate layer 112 having a lower surface 112b is formed to cover the grounding layer 110g2, the transmitting pad 110t and the receiving pad 110r. Then, the conductive layer 113 is formed on the lower surface 112b.

Figure 6G:
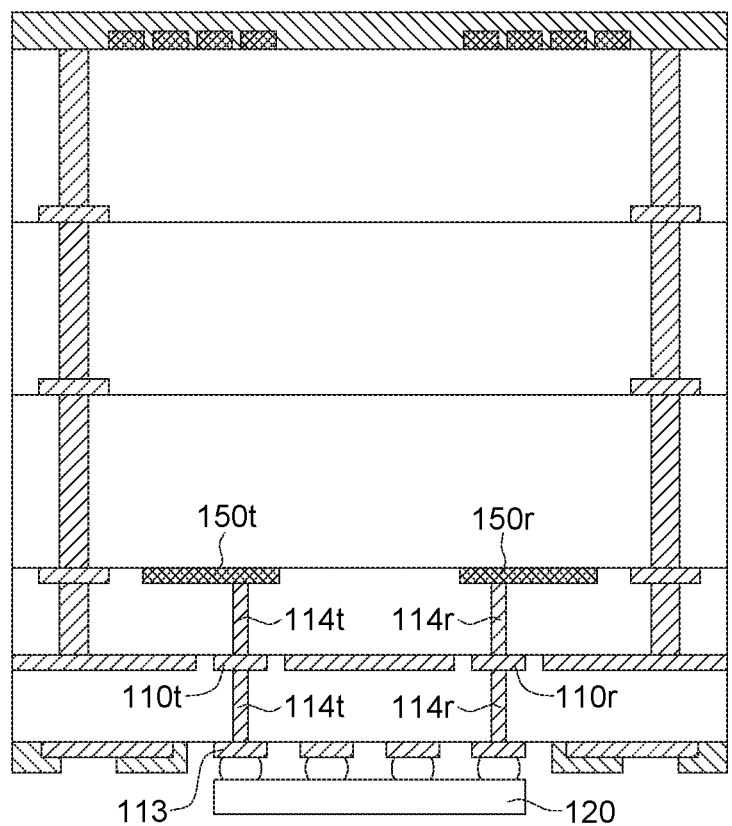

As illustrated in FIG. 6G, the electronic component 120 is disposed on the conductive layer 113 for being electrically connected to the transmitting antenna 150t through the transmitting portion 114t and the transmitting pad 110t, and being electrically connected to the receiving antenna 150r through the receiving portion 114 and the receiving pad 110r.

Then, a plurality of contacts 170 are formed on the conductive layer 113 to form the semiconductor package 100 of FIG. 1A.

FIGS. 7A to 7F illustrate manufacturing processes of the semiconductor package 200 of FIG. 2A.

Figure 7A:
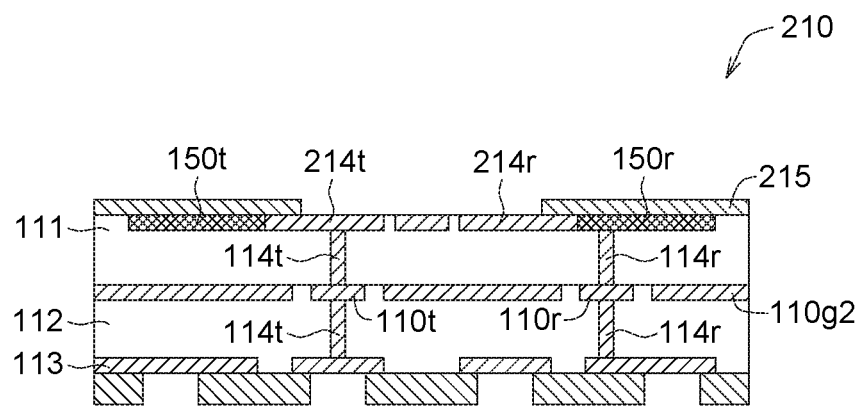
FIGS. 7A to 7F illustrate manufacturing processes of the semiconductor package of FIG. 2A.

As illustrated in in FIG. 7A, the substrate 210 is provided. The substrate 210 includes the grounding layer 110g2, the transmitting pad 110t, the receiving pad 110r, the first substrate layer 111, the second substrate layer 112, the conductive layer 113, at least one transmitting portion 114t, at least one receiving portion 114r, at least one transmitting portion 214t and at least one receiving portion 214r. In an embodiment, the substrate 210 is, for example, an interposer substrate. In addition, the transmitting antenna 150t and the receiving antenna 150r, respectively, electrically connected to the transmitting portion 214t and the receiving portion 214r are formed in the first substrate layer 111 of the substrate 210. Then, the first adhesion 215 covering the transmitting antenna 150t and the receiving antenna 150r is formed on the first substrate layer 111.

Figure 7B:
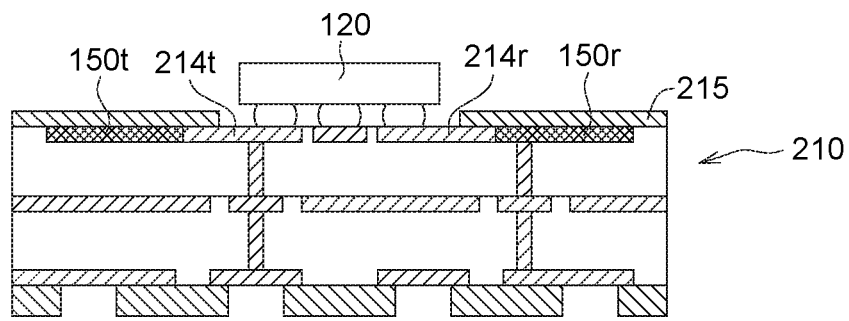

As illustrated in FIG. 7B, the electronic component 120 is disposed on the transmitting portion 214t and the receiving portion 214r and electrically connected to the transmitting antenna 150t and the receiving antenna 150r through the transmitting portion 214t and the receiving portion 214.

Figure 7C:
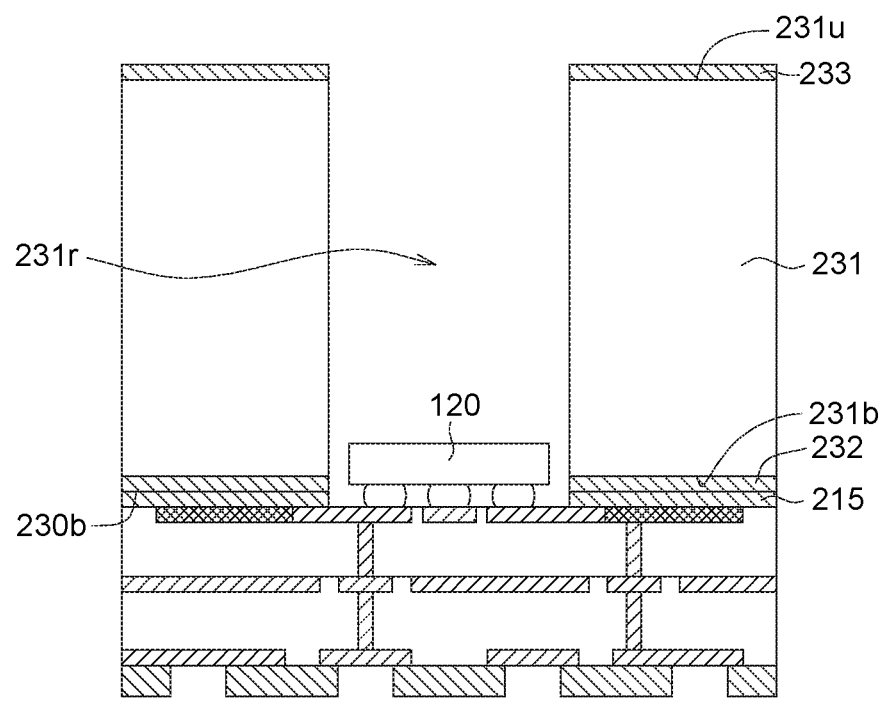

As illustrated in in FIG. 7C, the dielectric portion 231 having the upper surface 231u and the lower surface 231b opposite to the upper surface 231u, the second adhesion 232 having the dielectric lower surface 230b and the third adhesion 233 is formed above the first adhesion 215, wherein the second adhesion 232 is formed on the lower surface 231b of the dielectric portion 231, and the third adhesion 233 is formed on the upper surface 231u. The dielectric portion 231 surrounds the resonant cavity 231r within which the electronic component 120 is disposed. The resonant cavity 231r is, for example, a gas layer (for example, air layer) or a vacuum layer, that is, there is no physical component formed within the resonant cavity 231r.

Figure 7D:
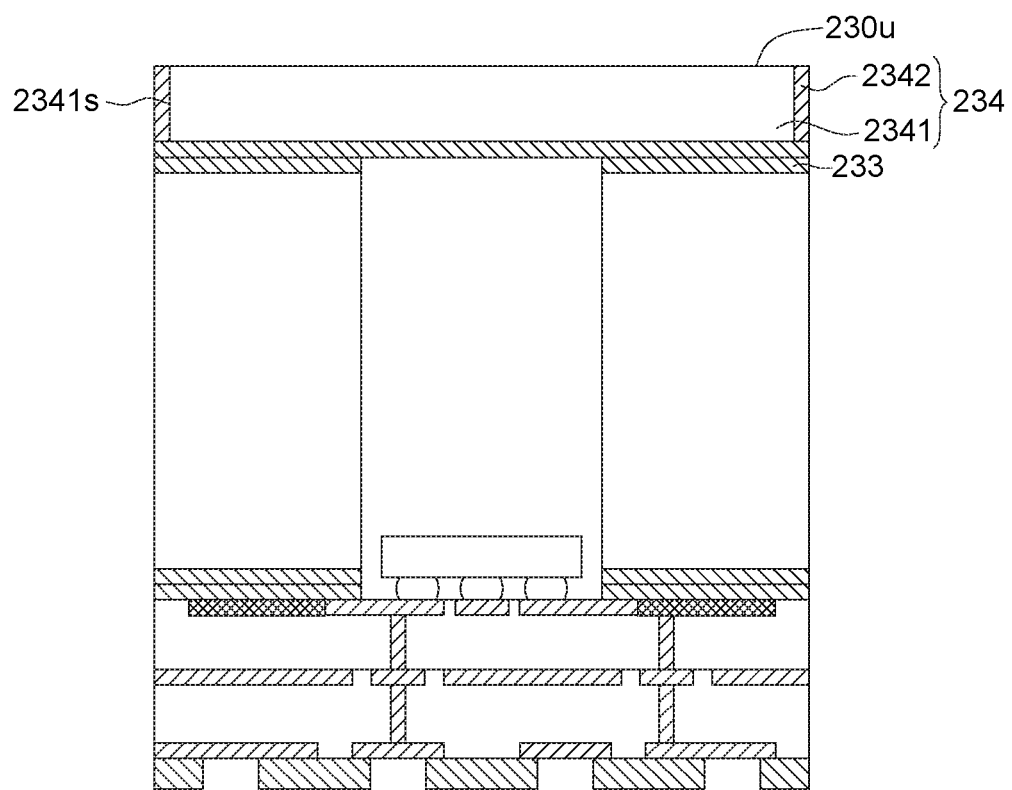

As illustrated in in FIG. 7D, the interposer 234 having the dielectric upper surface 230u is formed on the third adhesion 233, wherein the interposer 234 includes the substrate 2341 and the shielding portion 2342 surrounding the lateral surface 2341s of the substrate 2341. The shielding portion 2342 is exposed from the interposer 234. The shielding portion 2342 is, for example, a closed-ring or a pillar.

Figure 7E:
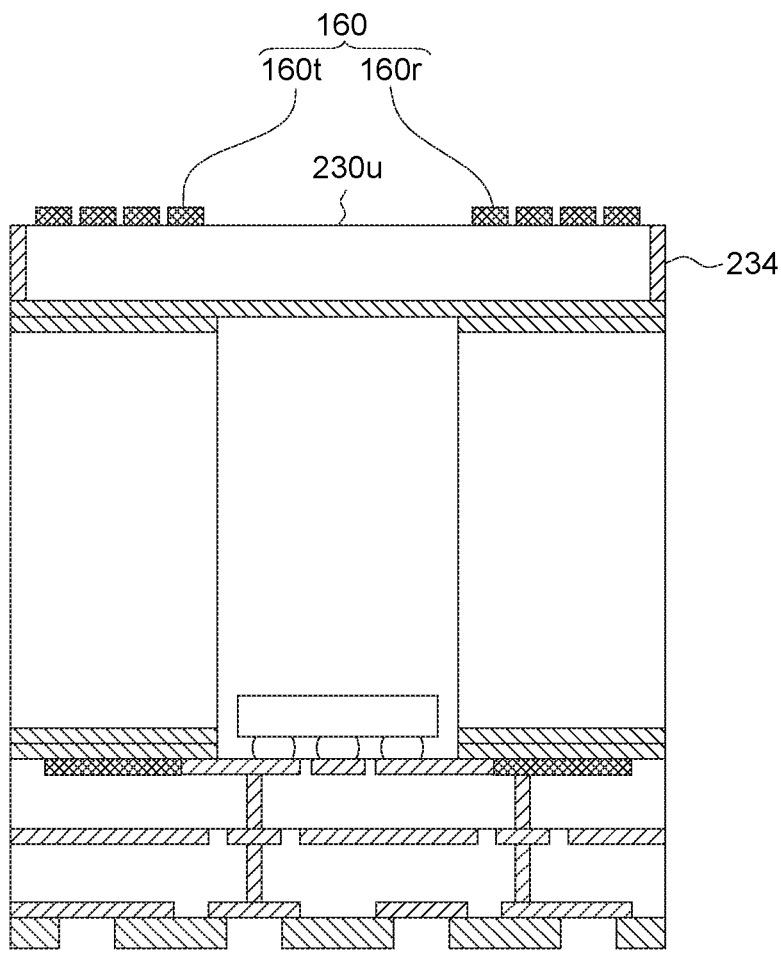

As illustrated in in FIG. 7E, the FSS antenna 160 including the transmitting antenna 160t and the receiving antenna 160r is formed on the dielectric upper surface 230u of the interposer 234.

Figure 7F:
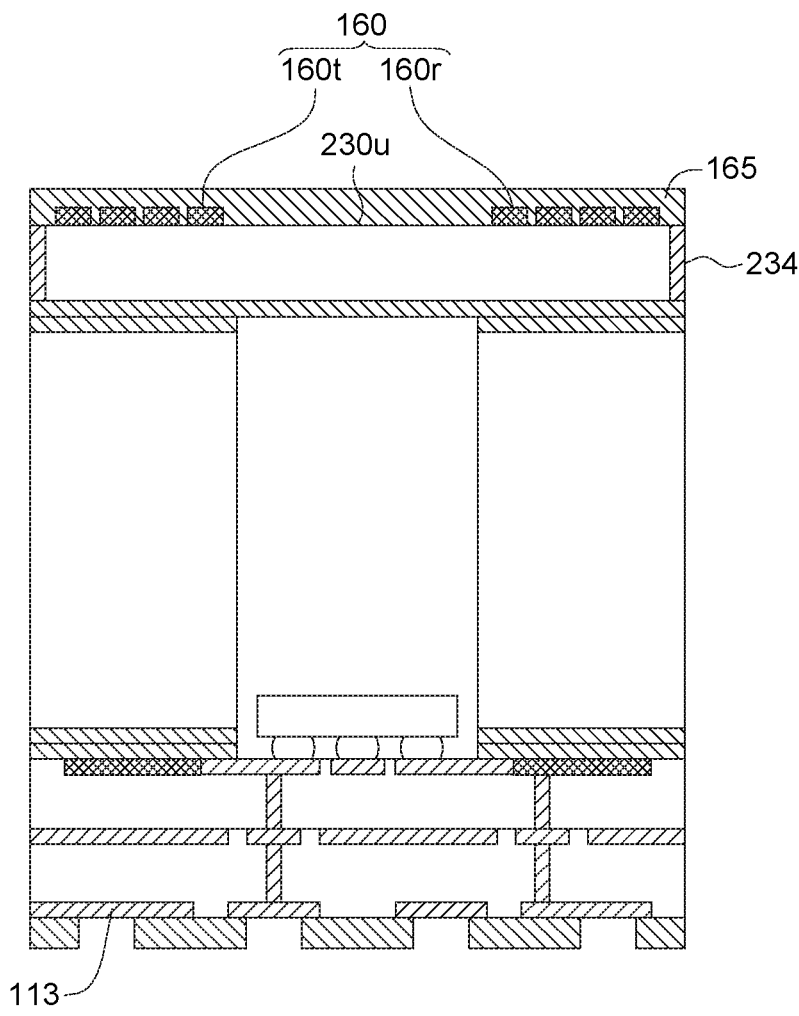

As illustrated in in FIG. 7F, the insulation layer 165 covering the FSS antenna 160 is formed on the dielectric upper surface 230u of the interposer 234.

Then, a plurality of contacts 170 are formed on the conductive layer 113 to form the semiconductor package 200 of FIG. 2A.

Figure 8A:
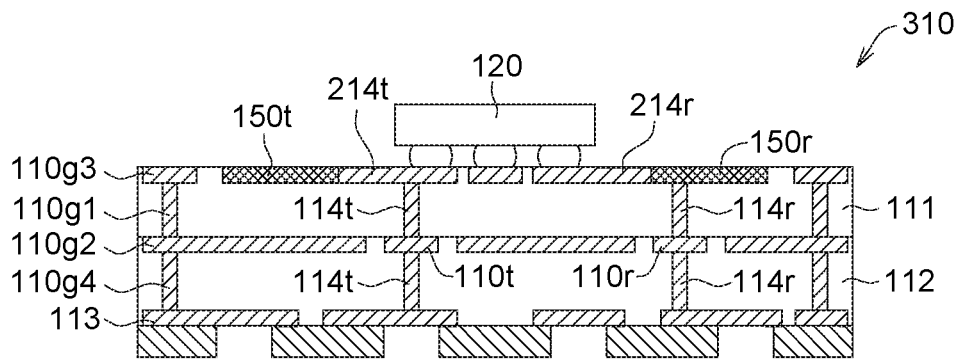
FIGS. 8A to 8C illustrate manufacturing processes of the semiconductor package of FIG. 3A.
Figure 8B:
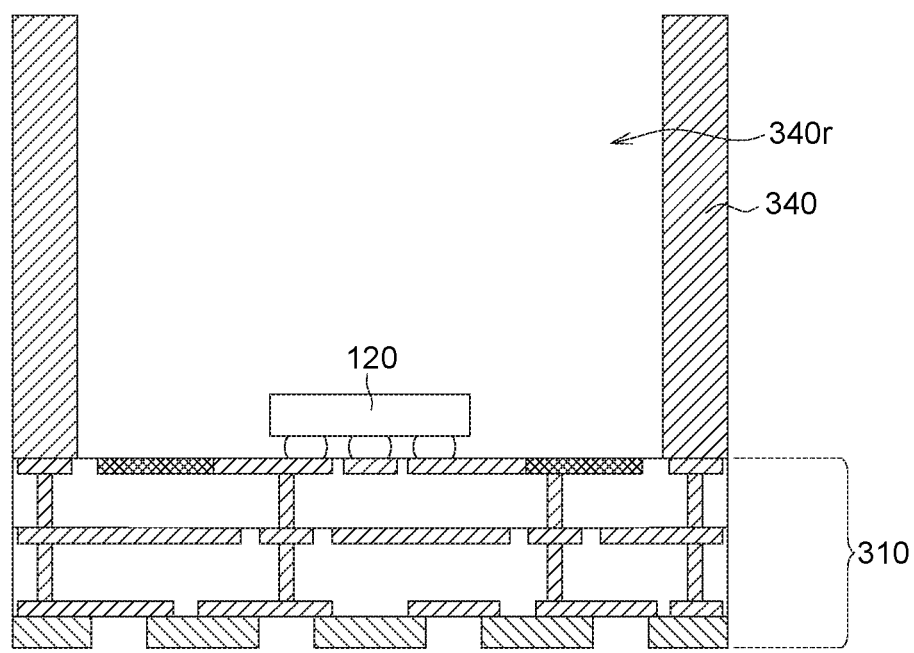
Figure 8C:
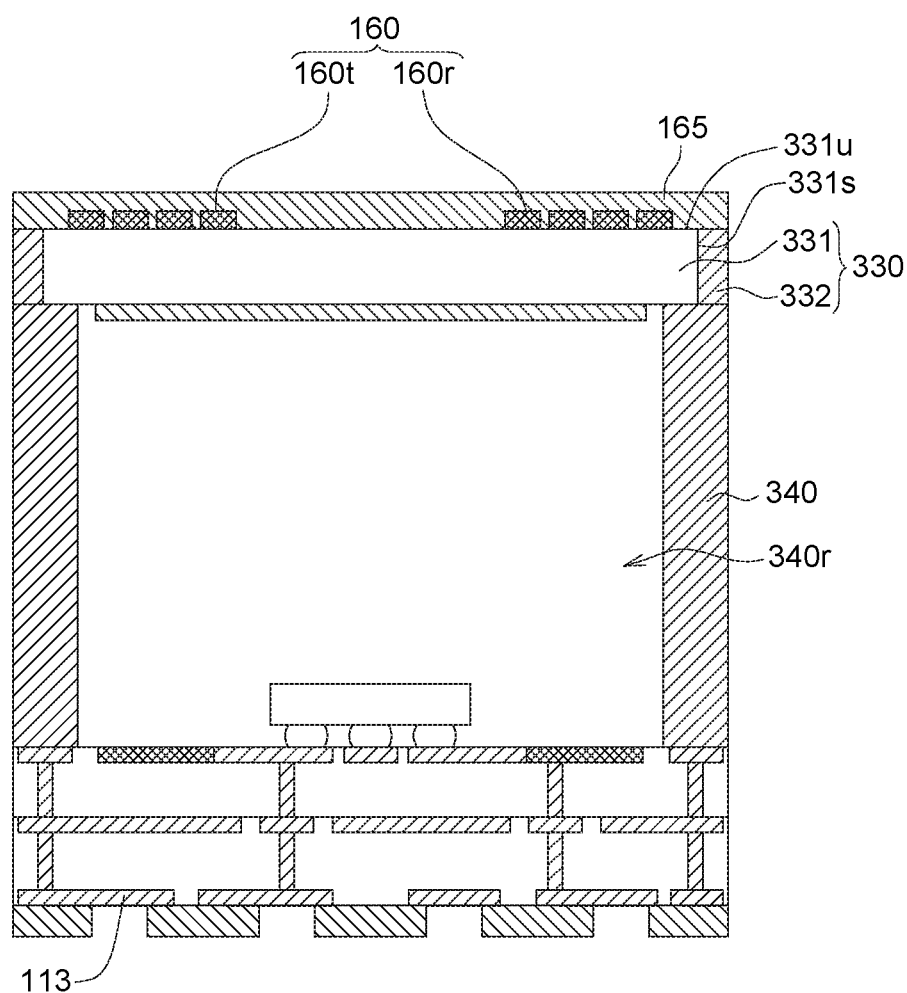

FIGS. 8A to 8C illustrate manufacturing processes of the semiconductor package 300 of FIG. 3A.

As illustrated in in FIG. 8A, the substrate 310 is provided. The substrate 310 includes at least one shielding portion 110g1, the grounding layer 110g2, at least one grounding pad 110g3, at least one grounding portion 110g4, the transmitting pad 110t, the receiving pad 110r, the first substrate layer 111, the second substrate layer 112, the conductive layer 113, at least one transmitting portion 114t, at least one receiving portion 114r, at least one transmitting portion 214t and at least one receiving portion 214r. In an embodiment, the substrate 310 is, for example, an interposer substrate. In addition, the transmitting antenna 150t and the receiving antenna 150r, respectively, electrically connected to the transmitting portion 214t and the receiving portion 214r are formed in the first substrate layer 111 of the substrate 310.

Then, the electronic component 120 is disposed on the transmitting portion 214t and the receiving portion 214r and electrically connected to the transmitting antenna 150t and the receiving antenna 150r through the transmitting portion 214t and the receiving portion 214.

As illustrated in in FIG. 8B, the shielding wall 340 surrounding the resonant cavity 340r is disposed on the substrate 310 within which the electronic component 120 is disposed.

As illustrated in in FIG. 8C, the dielectric layer 330 including the substrate 331 and the shielding portion 332 surrounding the lateral surface 331s of the substrate 331 is disposed on the shielding wall 340, wherein the shielding portion 332 is electrically connected to the shielding wall 340. Then, the FSS antenna 160 including the transmitting antenna 160t and the receiving antenna 160r is formed on the dielectric upper surface 331u of the substrate 331. Then, the insulation layer 165 covering the FSS antenna 160 is formed on the dielectric upper surface 331u of the substrate 331.

Then, a plurality of contacts 170 are formed on the conductive layer 113 to form the semiconductor package 300 of FIG. 3A.

Figure 9A:
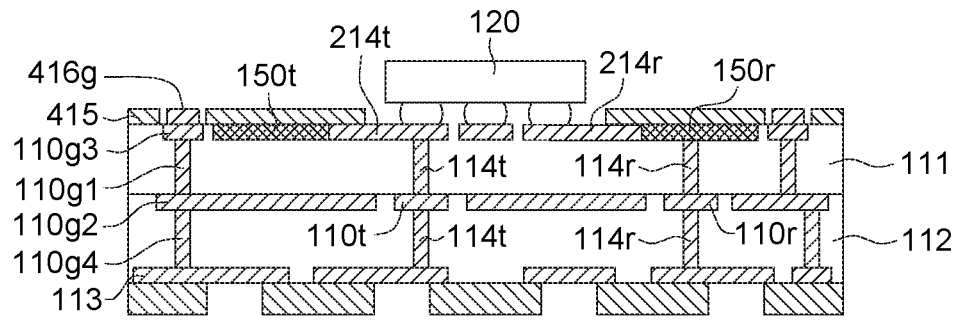
FIGS. 9A to 9C illustrate manufacturing processes of the semiconductor package of FIG. 4A.
Figure 9B:
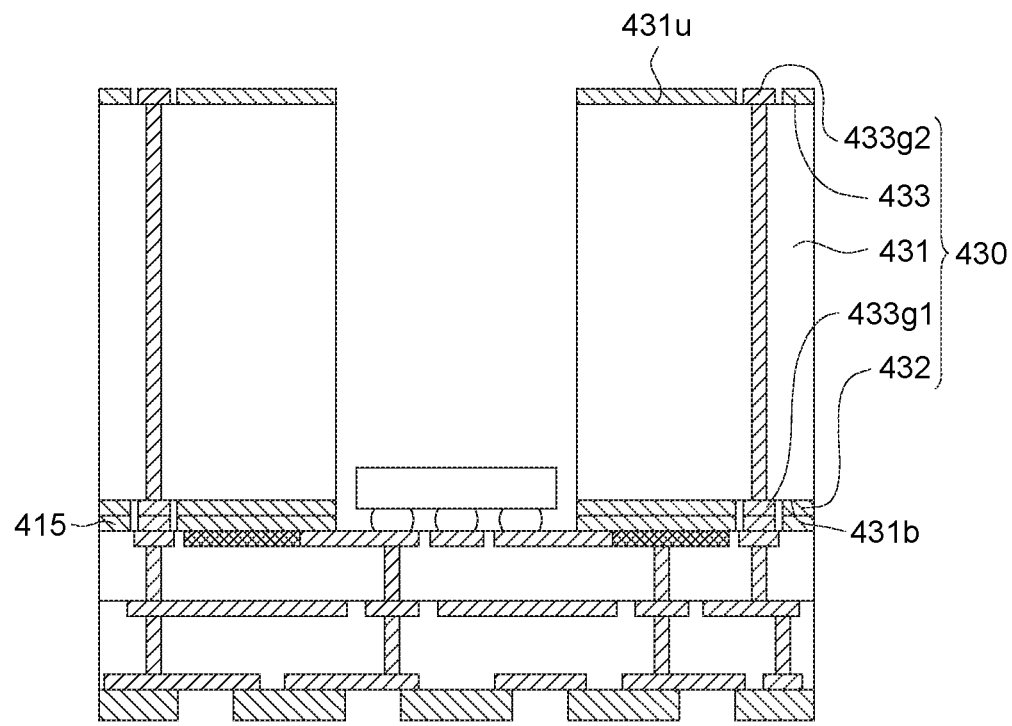
Figure 9C:
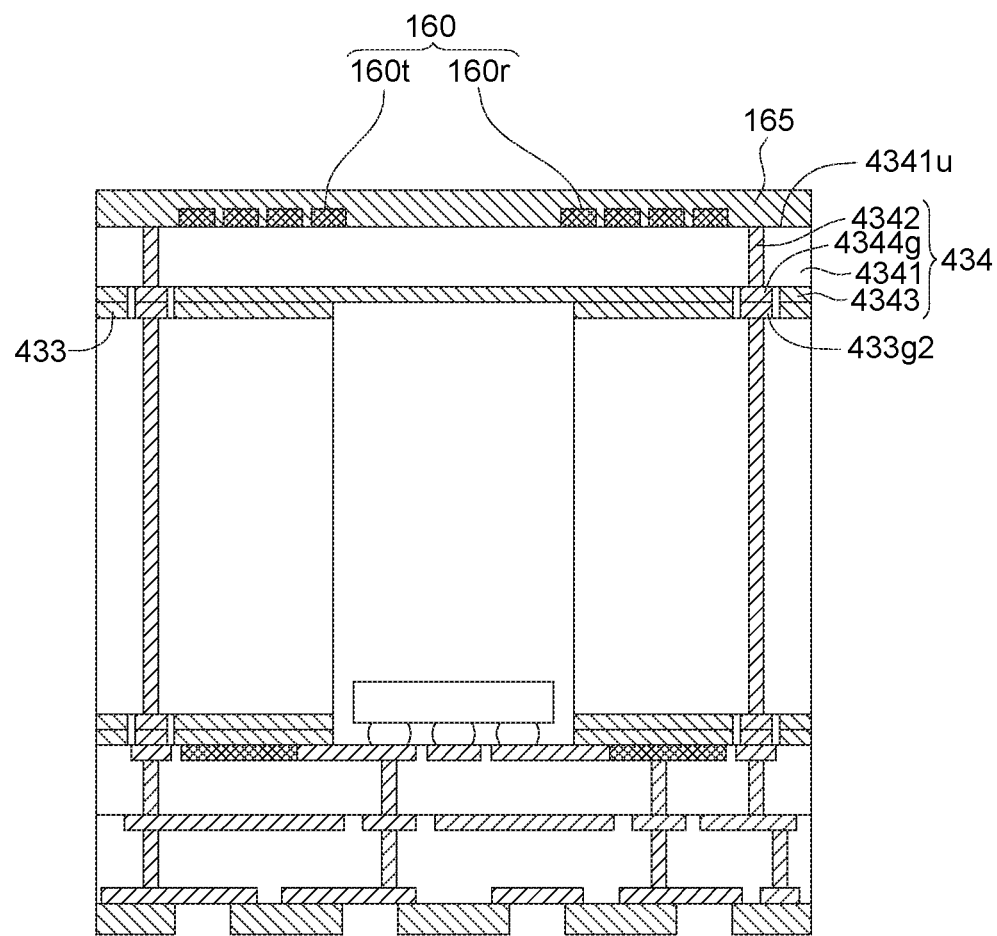

FIGS. 9A to 9C illustrate manufacturing processes of the semiconductor package 400 of FIG. 4A.

As illustrated in in FIG. 9A, the substrate 410 is provided. The substrate 410 includes at least one shielding portion 110g1, the grounding layer 110g2, at least one grounding pad 110g3, at least one grounding portion 110g4, the transmitting pad 110t, the receiving pad 110r, the first substrate layer 111, the second substrate layer 112, the conductive layer 113, at least one transmitting portion 114t, at least one receiving portion 114r, at least one transmitting portion 214t, at least one receiving portion 214r. In an embodiment, the substrate 410 is, for example, an interposer substrate. In addition, the transmitting antenna 150t and the receiving antenna 150r, respectively, electrically connected to the transmitting portion 214t and the receiving portion 214r are formed in the first substrate layer 111 of the substrate 410. Then, the first adhesion 415 and the grounding pad 416g covering the transmitting antenna 150t and the receiving antenna 150r are formed on the first substrate layer 111.

Then, the electronic component 120 is disposed on and electrically connected to the receiving portion 214r and the receiving portion 214r 5.

As illustrated in in FIG. 9B, the dielectric layer 430 is disposed on the first adhesion 415 of the substrate 410. The dielectric layer 430 includes the dielectric portion 431 having the upper surface 431u and the lower surface 431b opposite to the upper surface 431u, the second adhesion 432 formed on the lower surface 431b, the third adhesion 433 formed on the upper surface 431u, the first grounding pad 433g1 and the second grounding pad 433g2.

As illustrated in in FIG. 9C, the interposer 434 including the substrate 4341, the shielding portion 4342, the fourth adhesion 4343 and the grounding pad 4344g. The shielding portion 4342 is embedded in the substrate 4341 and electrically connected to the grounding pad 4344g. The shielding portion 4342 is a closed-ring or a pillar. The shielding portion 4342 is electrically connected to the shielding wall 440 through the grounding pad 4344g and the second grounding pad 433g2 connected to the shielding wall 440.

Then, the FSS antenna 160 including the transmitting antenna 160t and the receiving antenna 160r is formed on a dielectric upper surface 4341u of the substrate 4341.

Then, a plurality of contacts 170 are formed on the conductive layer 113 to form the semiconductor package 400 of FIG. 4A.

FIGS. 10A to 10K illustrate manufacturing processes of the semiconductor package 500 of FIG. 5A.

Figure 10A:
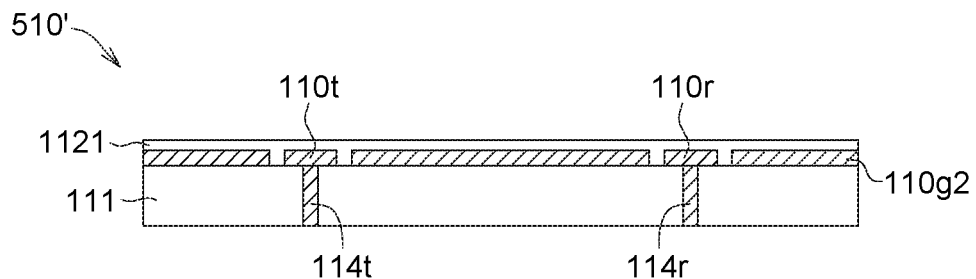
FIGS. 10A to 10K illustrate manufacturing processes of the semiconductor package of FIG. 5A.

As illustrated in in FIG. 10A, a carrier 510' is formed, wherein the carrier 510' includes the first substrate layer 111, the transmitting portion 114t, the receiving portion 114r, the grounding layer 110g2, the transmitting pad 110t, the receiving pad 110r and the carrier layer 1121 of the second substrate layer 112. The carrier layer 1121 covers the grounding layer 110g2, the transmitting pad 110t and the receiving pad 110r. The transmitting portion 114t and the receiving portion 114r are embedded in the first substrate layer 111, wherein the transmitting portion 114t is electrically to the transmitting pad 110t, and the receiving portion 114r is electrically to the receiving pad 110r. In addition, the carrier 510' has a thickness with enough strength.

Figure 10B:
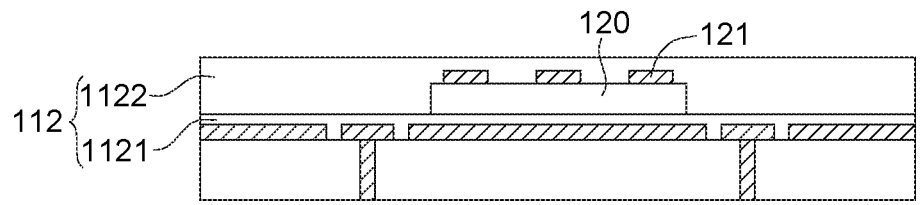

As illustrated in in FIG. 10B, the electronic component 120 including at least one contact 121 is disposed on the carrier layer 1121. Then, the covering layer 1122 of the second substrate layer 112 is formed to encapsulate the electronic component 120.

Figure 10C:
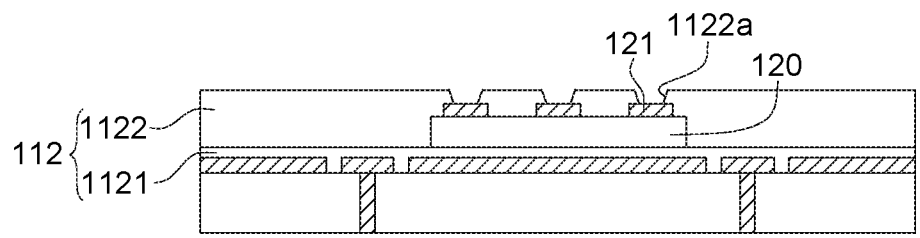

As illustrated in in FIG. 10C, at least one opening 1122a is formed to expose the contacts 121 of the electronic component 120.

Figure 10D:
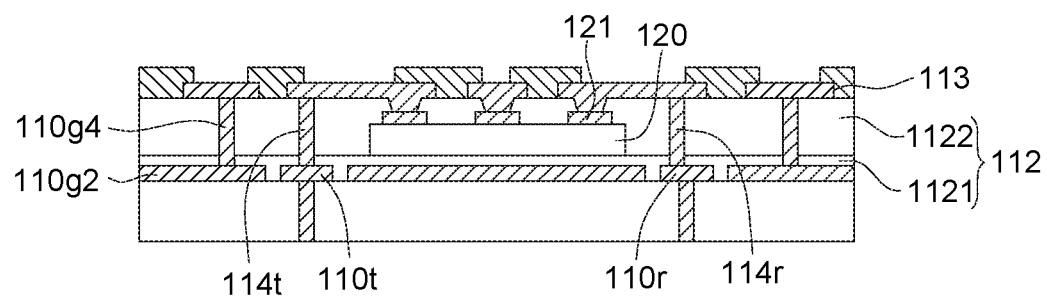

As illustrated in in FIG. 10D, the grounding portion 110g4, at least one transmitting portion 114t and at least one receiving portion 114r are formed to pass through the carrier layer 1121 and the covering layer 1122, wherein the grounding portion 110g4 extend to the grounding layer 110g2 from the conductive layer 113, the transmitting portion 114t extend to the transmitting pad 110t from the conductive layer 113, and the receiving portion 114r extend to the receiving pad 110r from the conductive layer 113.

Figure 10E:
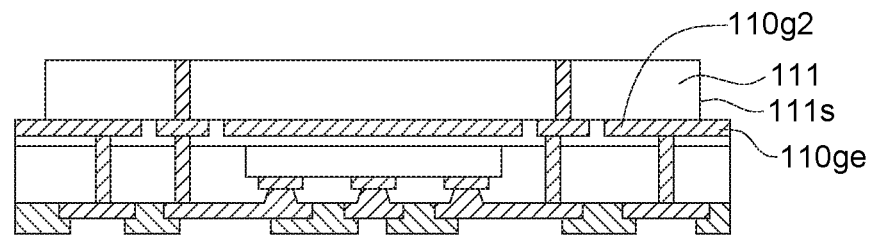

As illustrated in in FIG. 10E, a portion of the first substrate layer 111 is removed to expose the edge portion 110ge of the grounding layer 110g2. After being removed, the first substrate layer 111 has the lateral surface 111s.

Figure 10F:
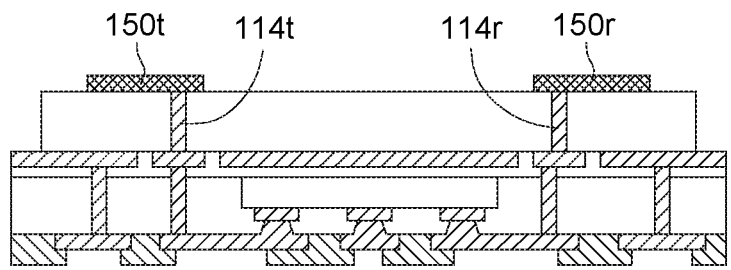

As illustrated in in FIG. 10F, the transmitting antenna 150t and the receiving antenna 150r are formed to be electrically connected to the transmitting portion 114t and the receiving portion 114r respectively.

Figure 10G:
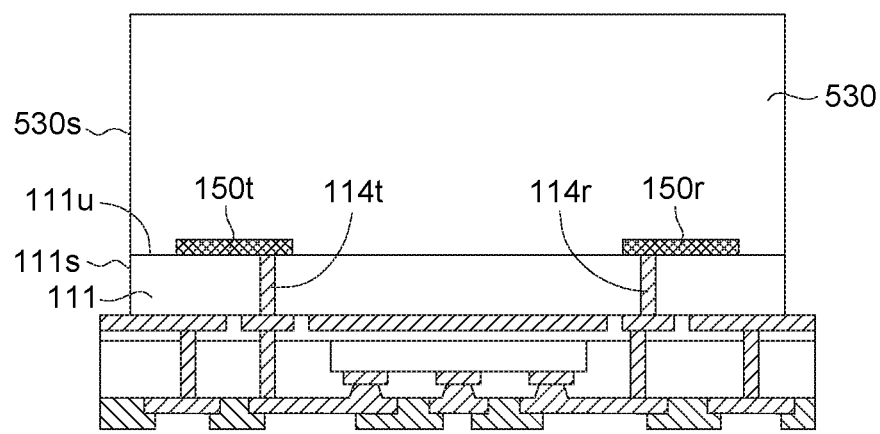

As illustrated in in FIG. 10G, the dielectric layer 530 encapsulating the transmitting antenna 150t and the receiving antenna 150r is formed on the substrate upper surface 111u of the first substrate layer 111. The dielectric layer 530 has the lateral surface 530s, wherein the lateral surface 530s and the lateral surface 111s are aligned with or flush with each other.

Figure 10H:
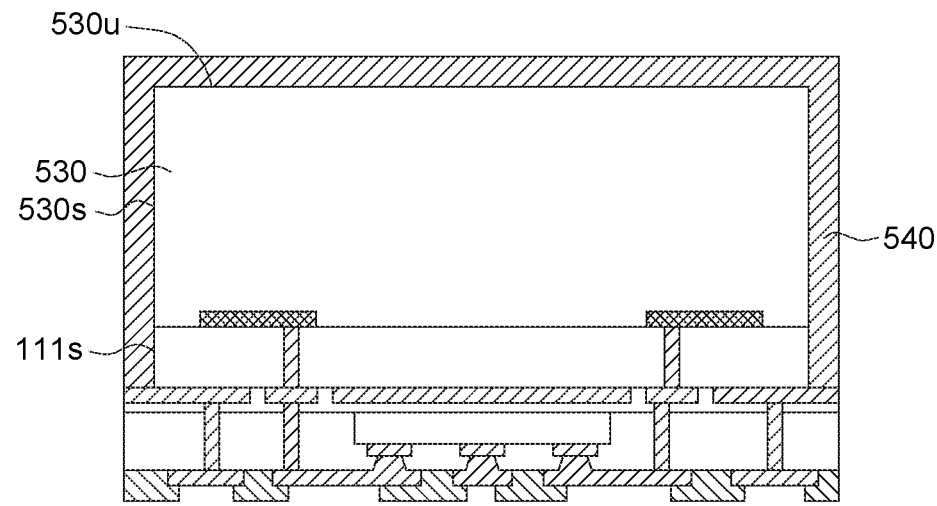

As illustrated in in FIG. 10H, the shielding wall 540 covering the lateral surface 530s, the lateral surface 111s and an dielectric upper surface 530u of the dielectric layer 530 is formed.

Figure 10I:
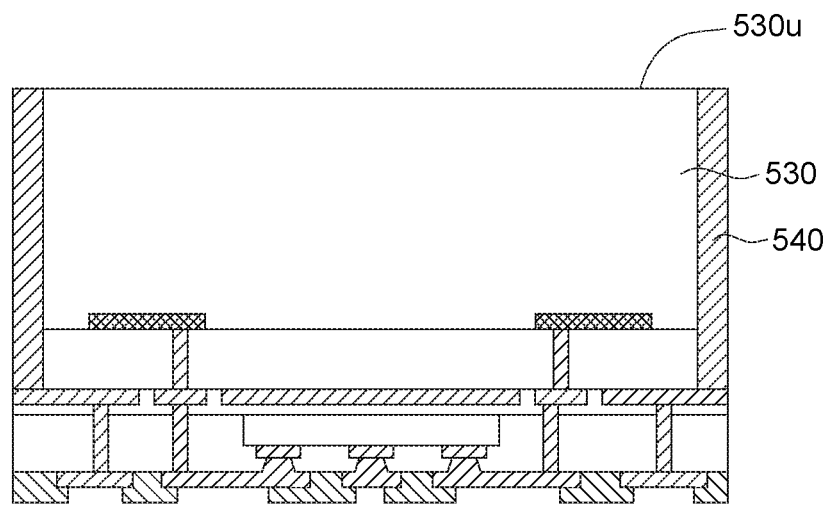

As illustrated in in FIG. 10I, a portion of the shielding wall 540 is removed to expose the dielectric upper surface 530u of the dielectric layer 530.

Figure 10J:
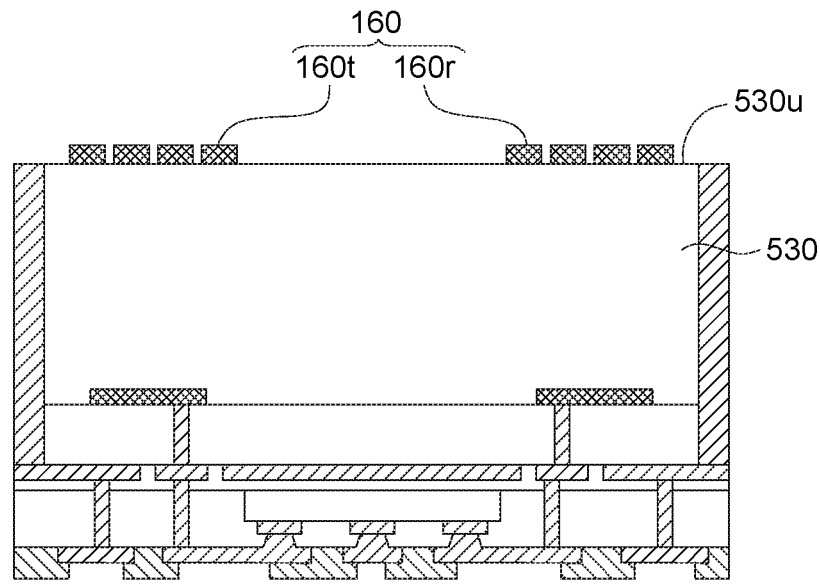
Figure 10K:
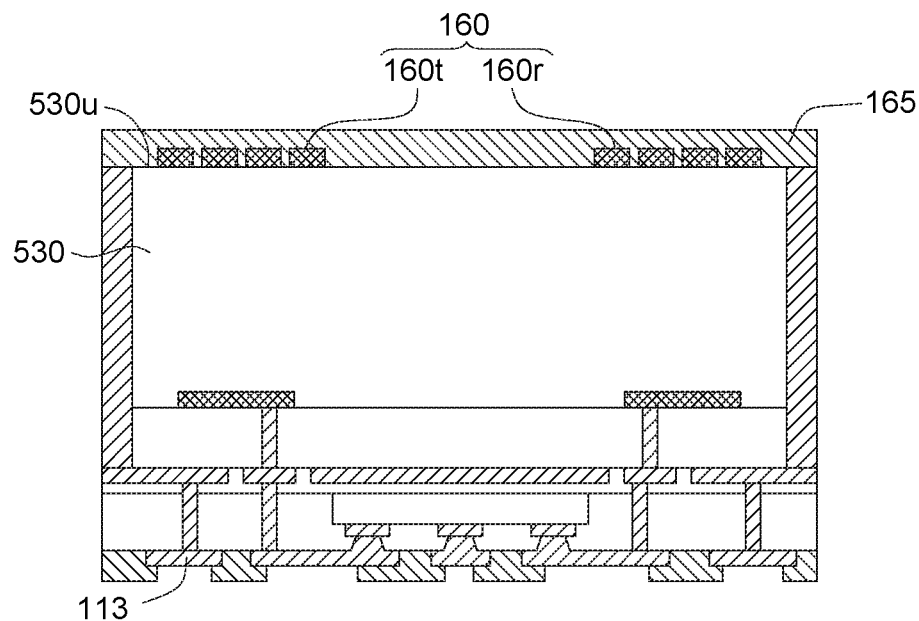

As illustrated in in FIG. 10J, the FSS antenna 160 including the transmitting antenna 160t and the receiving antenna 160r is formed on the dielectric upper surface 530u of the dielectric layer 530.

Then, the insulation layer 165 covering the FSS antenna 160 is formed on the dielectric upper surface 530u of the dielectric layer 530.

Then, a plurality of contacts 170 are formed on the conductive layer 113 to form the semiconductor package 500 of FIG. 5A.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprising:
    a substrate;
    an electronic component disposed on and electrically connected with the substrate;
    a dielectric layer having a dielectric upper surface;
    a transmitting antenna and a receiving antenna formed adjacent to the substrate; and
    a FSS (Frequency selective surface) antenna formed adjacent to the dielectric upper surface of the dielectric layer;
    wherein the FSS antenna is separated from the substrate by the dielectric layer in a wireless signal emitting direction;
    wherein the substrate further comprises:
        a grounding layer formed in the substrate, overlapping the electronic component along a vertical direction and having a first through hole and a second through hole;
        a transmitting pad disposed within the first through hole; and
        a receiving pad within the second through hole;
        wherein the transmitting antenna is electrically connected with the electronic component through the transmitting pad, and the receiving antenna is electrically connected with the electronic component through the second receiving pad.

2. The semiconductor package as claimed in claim 1, wherein the dielectric layer has a permittivity ranging between 1.1 mm to 1.3 mm.

3. The semiconductor package as claimed in claim 1, further comprises:
    a shielding wall shaped as a closed-ring.

4. The semiconductor package as claimed in claim 3, wherein the shielding wall coves a peripheral surface of the dielectric layer and extending between a substrate lower surface of the substrate and the dielectric upper surface.

5. The semiconductor package as claimed in claim 3, wherein the substrate further comprises:
    a grounding pad connected to the shielding wall and surrounding the transmitting antenna and the receiving antenna.

6. The semiconductor package as claimed in claim 5, wherein the grounding layer is formed on a dielectric lower surface of the dielectric layer opposite to the dielectric upper surface;
    wherein the substrate further comprises:
        a grounding portion connecting the grounding pad to the grounding layer.

7. The semiconductor package as claimed in claim 1, wherein the shielding wall is embedded in the dielectric layer and extending between a dielectric lower surface of the dielectric layer and the dielectric upper surface of the dielectric layer.

8. The semiconductor package as claimed in claim 1, wherein the dielectric layer comprises a dielectric portion surrounding a resonant cavity within which the electronic component is disposed.

9. The semiconductor package as claimed in claim 1, further comprises:
    a shielding wall disposed on a dielectric lower surface of the dielectric layer and surrounding a resonant cavity within which the electronic component is disposed.

10. The semiconductor package as claimed in claim 9, wherein the transmitting antenna and the receiving antenna are disposed within the resonant cavity.

11. The semiconductor package as claimed in claim 1, wherein the dielectric layer is a physical material, and the transmitting antenna and the receiving antenna are projected with respect to the dielectric lower surface of the dielectric layer.

12. The semiconductor package as claimed in claim 1, wherein the dielectric layer is a physical material, and the transmitting antenna and the receiving antenna are embedded in the dielectric layer.

13. The semiconductor package as claimed in claim 12, wherein the transmitting antenna and the receiving antenna have a first antenna lower surface and a second antenna lower surface respectively, and the first antenna lower surface, the second antenna lower surface and the lower surface are flush with each other.

14. The semiconductor package as claimed in claim 1, wherein the dielectric layer is a molding component covering a substrate upper surface of the substrate and encapsulating the transmitting antenna and the receiving antenna.

15. The semiconductor package as claimed in claim 1, wherein the substrate has a substrate lower surface, and the electronic component is disposed on the substrate lower surface.

16. The semiconductor package as claimed in claim 1, wherein the electronic component is embedded in the substrate.

17. The semiconductor package as claimed in claim 16, wherein the substrate comprises:
    a first substrate layer having a lateral surface and a lower surface on which the grounding layer is formed; and
    a shielding wall formed on the lateral surface of the first substrate layer and extending to the grounding layer.

18. The semiconductor package as claimed in claim 17, wherein the substrate further comprises:
    a second substrate layer formed on the first substrate layer and encapsulating the electronic component.

19. A semiconductor package, comprising:
    a substrate;
    an electronic component disposed on and electrically connected with the substrate;
    a dielectric layer having a dielectric upper surface and comprising a dielectric portion surrounding a resonant cavity within which the electronic component is disposed;
    a transmitting antenna and a receiving antenna formed adjacent to the substrate; and
    a FSS antenna formed adjacent to the dielectric upper surface of the dielectric layer, wherein the FSS antenna is separated from the substrate by the dielectric portion in a wireless signal emitting direction, and the electronic component is exposed in the resonant cavity;

wherein the substrate further comprises:
- a grounding layer formed in the substrate, overlapping the electronic component along a vertical direction and having a first through hole and a second through hole;
- a transmitting pad disposed within the first through hole; and
- a receiving pad within the second through hole;
- wherein the transmitting antenna is electrically connected with the electronic component through the transmitting pad, and the receiving antenna is electrically connected with the electronic component through the second receiving pad.

* * * * *